(12) United States Patent
Kariyazaki et al.

(10) Patent No.: US 9,620,447 B2
(45) Date of Patent: Apr. 11, 2017

(54) SEMICONDUCTOR DEVICE

(71) Applicant: Renesas Electronics Corporation, Tokyo (JP)

(72) Inventors: Shuuichi Kariyazaki, Tokyo (JP); Ryuichi Oikawa, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/059,948

(22) Filed: Mar. 3, 2016

(65) Prior Publication Data

US 2016/0190049 A1 Jun. 30, 2016

Related U.S. Application Data

(63) Continuation of application No. 14/590,291, filed on Jan. 6, 2015, now Pat. No. 9,312,216.

(30) Foreign Application Priority Data

Jan. 27, 2014 (JP) .................................. 2014-012155

(51) Int. Cl.
*H01L 23/498* (2006.01)
*H05K 1/02* (2006.01)
(Continued)

(52) U.S. Cl.
CPC .. *H01L 23/49822* (2013.01); *H01L 23/49811* (2013.01); *H01L 23/49827* (2013.01);
(Continued)

(58) Field of Classification Search
None
See application file for complete search history.

(56) References Cited

U.S. PATENT DOCUMENTS 5,682,124 A * 10/1997 Suski ...................... H01P 3/081
174/254
7,394,027 B2 * 7/2008 Kaluzni .................. H01L 23/66
174/262

(Continued)

FOREIGN PATENT DOCUMENTS

JP 2004-253947 A 9/2004

OTHER PUBLICATIONS

Namhoon Kim et al., "Spiral Via Structure in a BGA Package to Mitigate Discontinuities in Multi-Gigabit SERDES System", Proceedings of 60th Electronic Components and Technology Conference, 2010, pp. 1474-1478.

(Continued)

*Primary Examiner* — Joseph Schoenholtz
(74) *Attorney, Agent, or Firm* — Sughrue Mion, PLLC

(57) ABSTRACT

To improve noise immunity of a semiconductor device. A wiring substrate of a semiconductor device includes a first wiring layer where a wire is formed to which signals are sent, and a second wiring layer that is mounted adjacent to the upper layer or the lower layer of the first wiring layer. The second wiring layer includes a conductor plane where an aperture section is formed at a position overlapped with a portion of the wire 23 in the thickness direction, and a conductor pattern that is mounted within the aperture section of the conductor plane. The conductor pattern includes a main pattern section (mesh pattern section) that is isolated from the conductor plane, and plural coupling sections that couple the main pattern section and the conductor plane.

11 Claims, 18 Drawing Sheets

(51) Int. Cl.
    *H01L 23/522*  (2006.01)
    *H01L 23/00*   (2006.01)
(52) U.S. Cl.
    CPC .... *H01L 23/49838* (2013.01); *H01L 23/5225* (2013.01); *H01L 24/17* (2013.01); *H05K 1/0253* (2013.01); *H01L 23/49816* (2013.01); *H01L 24/05* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 2224/0401* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05644* (2013.01); *H01L 2224/05655* (2013.01); *H01L 2224/131* (2013.01); *H01L 2224/13147* (2013.01); *H01L 2224/13155* (2013.01); *H01L 2224/14131* (2013.01); *H01L 2224/14135* (2013.01); *H01L 2224/16057* (2013.01); *H01L 2224/16113* (2013.01); *H01L 2224/16225* (2013.01); *H01L 2224/16227* (2013.01); *H01L 2224/2919* (2013.01); *H01L 2224/32225* (2013.01); *H01L 2224/73204* (2013.01); *H01L 2224/81815* (2013.01); *H01L 2224/83104* (2013.01); *H01L 2924/1517* (2013.01); *H01L 2924/15311* (2013.01); *H05K 1/0225* (2013.01); *H05K 2201/09336* (2013.01); *H05K 2201/09681* (2013.01)

(56) References Cited

U.S. PATENT DOCUMENTS

| | | | | |
|---|---|---|---|---|
| 8,058,954 | B2* | 11/2011 | Yeates | H01P 3/08 333/1 |
| 8,592,687 | B2* | 11/2013 | Kato | H01P 3/081 174/254 |
| 9,312,216 | B2* | 4/2016 | Kariyazaki | H01L 23/49822 |
| 2006/0243478 | A1* | 11/2006 | Inagaki | H01L 21/4857 174/255 |
| 2008/0190658 | A1* | 8/2008 | Toyoda | H01L 21/486 174/263 |

OTHER PUBLICATIONS

Nanju Na et al., "Package Performance Improvement with Counter-Discontinuity and its Effective Bandwidth", Proceedings of 16th Topical meeting on Electrical Performance of Electronic Packaging, 2007, pp. 163-166.

* cited by examiner

SEMICONDUCTOR DEVICE

CROSS-REFERENCE TO RELATED APPLICATION

This application is a continuation application of U.S. application Ser. No. 14/590,291, filed on Jan. 6, 2015, which claims priority from the disclosure of Japanese Patent Application No. 2014-012155 filed on Jan. 27, 2014 including the specification, drawings and abstract is incorporated herein by reference in its entirety.

BACKGROUND

1. Field

The present invention relates to technology for a semiconductor device, and relates to technology effective for example in semiconductor devices containing a semiconductor chip mounted over a wiring substrate having plural stacked wiring layers.

2. Related Art

Signal transmission paths to electrically couple circuits formed over the semiconductor chip and external devices are formed over the wiring substrate where the semiconductor chip is mounted. To render the impedance discontinuities formed over these signal circuit paths harmless a discontinuity cancellation technology is employed that cancels the impedance discontinuity by utilizing an inverse impedance discontinuity.

A technology is disclosed for example in Japanese Unexamined Patent Application Publication No. 2004-253947 (patent document 1) in which a third planar circuit having a characteristic impedance higher than a first planar circuit; and a fourth planar circuit having a characteristic impedance higher than a second planar circuit are serially coupled between a first planar circuit, and a second planar circuit having a higher characteristic impedance than the first planar circuit.

Also, the non-patent document 1 for example discloses a technology for matching an average impedance to a 50 ohm impedance by enclosing the front and back of a low-impedance section configured from a through via and a solder ball pad by a high-impedance line.

The non-patent document 2 for example discloses technology for matching an average impedance in a signal transmission path including a low-impedance section configured from a through via and a solder ball pad to a 50 ohm impedance by way of a conductor layer formed in a inductor configuration by combining a small via and a wiring pattern.
[Non-Patent Document 1]
Nanju Na, Mark Bailey and Asad Kalantarian, "Package Performance Improvement with Counter-Discontinuity and its Effective Bandwidth", Proceedings of 16th Topical meeting on Electrical Performance of Electronic Packaging, p. 163 to p. 166 (2007)
[Non-Patent Document 2]
Namhoon Kim, Hongsik Ahn, Chris Wyland, Ray Anderson, Paul Wu, "Spiral Via Structure in a BGA Package to Mitigate Discontinuities in Multi-Gigabit SERDES System", Proceedings of 60th Electronic Components and Technology Conference, p. 1474 to p. 1478 (2010)

SUMMARY

However, when employing the method for applying an inverse impedance discontinuity section in the opposite direction along the transmission path in order to cancel out the impedance discontinuity section, the frequency of the signal becomes higher and in some cases where the impedance cannot be cancelled out this state might function as a double impedance discontinuity. In other words, along the signal transmission path of the high-frequency signal, a signal is reflected at the boundary of the impedance discontinuity that is approximately twice the impedance discontinuity. Consequently, a countermeasure is required so that the impedance discontinuity section approaches the specified impedance (for example 50 ohms).

When an aperture section is formed over the conductor pattern of a separate layer to cover the section where the impedance discontinuity occurs in order to cancel out the capacitive impedance discontinuity, inductive crosstalk noise is prone to easily occur in that section since the return path (reflux current path) corresponding to the signal transmission path and the signal transmission path are separate from each at localized points.

Other novel features and issue will become readily apparent from the accompanying drawings and the description in the present specifications.

According to an aspect of the present invention, a wiring substrate in a semiconductor device includes a first wiring layer where a first wire to which signal are sent is formed, and a second wiring layer that is mounted adjacent to the upper layer or the lower layer of the first wiring layer. Also, a first conductor plate where a first aperture section is formed at a position overlapped with a portion of the first wire in the thickness direction; and a first conductor pattern placed within the first aperture section of the first conductor plate are formed over a second wiring layer. The first conductor pattern contains a mesh pattern section isolated from the first conductor plate; and plural coupling sections linking the mesh pattern section and the aforementioned conductor plate.

According to the aspect of the present invention, noise immunity of the semiconductor device can be improved.

DETAILED DESCRIPTION

Figure 1:
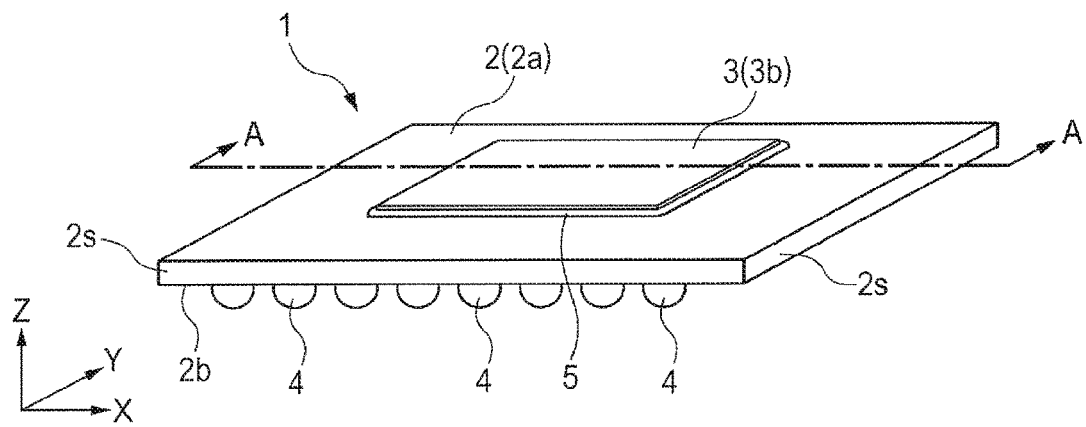
FIG. 1 is a perspective view of the semiconductor device of the present embodiment.

Description of Format, Basic Terminology, and Usage in these Specifications

In the present specifications, the description of the embodiment is divided into plural sections for purposes of convenience as needed, however unless specifically stated otherwise these are not mutually separate units and regardless of the overall description are single examples of a section, one section being a detailed sectional part of another section, or is one part or is the entire modification, etc. Also as a general rule, repetitive descriptions of the same sections are omitted. Also unless specifically stated to the contrary, among the structural elements in the embodiments, the structural element is not required except when logically limited to a stated quantity and except when clearly stated in the context.

Also, in descriptions about materials and compositions such as "X comprised of A", except for the case where specifically stated otherwise or the case where clearly stated otherwise from the context in the description of the embodiments, the description is not exclusive of elements other than A. Among ingredients for example, the description may signify "X comprising A as the main ingredient", etc. Even among expressions such as "silicon member", the members are not simply limited to silicon, and may of course be SiGe (silicon and germanium) alloy or other multi-element alloys utilizing Si as the main ingredient, or members including other additive elements. Also, among gold plating, copper (Cu) layers, and nickel and plating and so on, unless stated otherwise or unless specifically stated, the member is not a simple element and may also include gold, copper (CU), nickel, or other elements as the main ingredient.

Moreover, even in the case of a designated numerical value or numerical quantity, except when logically limited to a stated quantity or except when clearly stated otherwise in the context, the numerical value may exceed that designated numerical value and also be a numerical value below that designated numerical value.

The terms planar surface and side surface are utilized in these specifications. The semiconductor element forming surface of the semiconductor chip serves as the reference surface, and the level surface parallel to that reference surface is described as the planar surface. Moreover, the surface intersecting the planar surface is described as the side surface. The direction joining the two planar surfaces that are positioned apart from one another as seen from the side surface is described as the thickness direction.

The terms upper surface or lower surface are also utilized in the present specifications. However, there are various semiconductor package mounting states so after mounting the semiconductor package the upper surface might for example be placed below the lower surface in some cases. In the present specifications, the planar surface of the semiconductor element forming surface side of the semiconductor chip, or the planar surface of the chip mounting surface side of the wiring substrate, is described as the upper surface; and the surface that is place on the side opposite the upper surface is described as the lower surface.

In each of the drawings in the embodiment, identical sections or similar sections are shown by identical or similar numbers or reference numbers, and the description is generally not repeated.

In the accompanying drawings, hatching may be omitted even on cross sections if the drawings are complicated or if gaps can be clearly identified. In this connection, if clarified by the description, the contour lines in the background might be omitted even for level closed holes. Moreover, hatching or a dot pattern may be added in order to clearly specify there is no gap or to clearly indicate the boundary of a region even if not a cross section.

Embodiment

Figure 2:
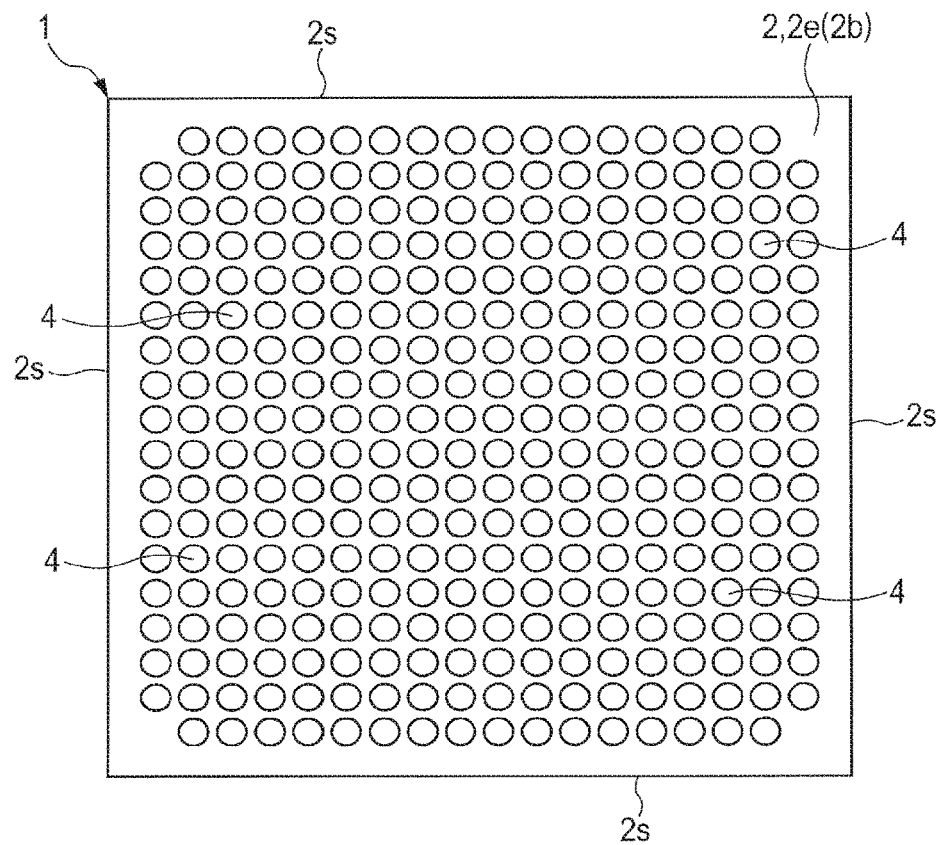
FIG. 2 is a bottom view of the semiconductor device shown in FIG. 1.
Figure 3:
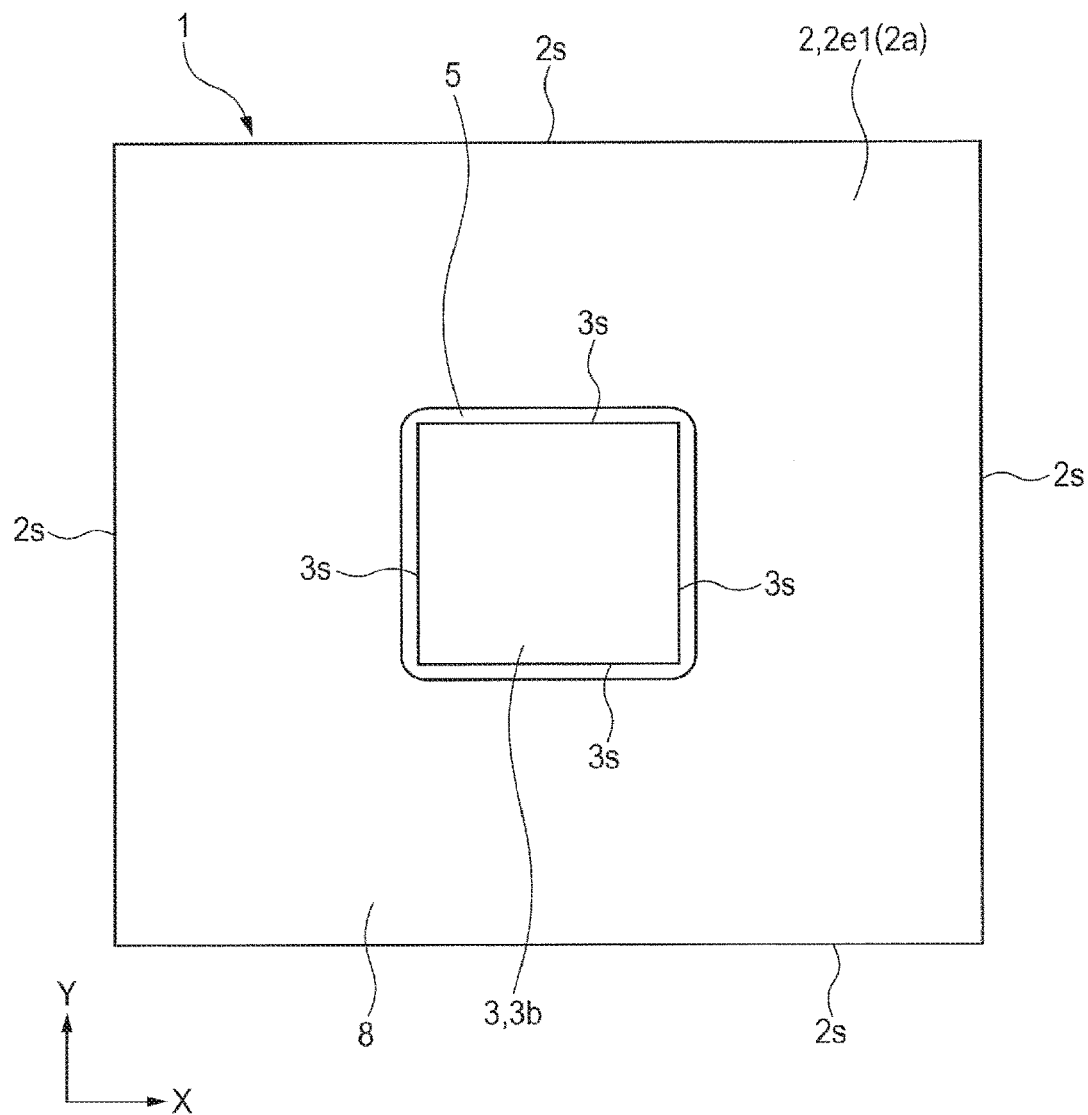
FIG. 3 is a perspective plan view showing the internal structure of the semiconductor device over the wiring substrate in a state with the heat sink removed.
Figure 4:
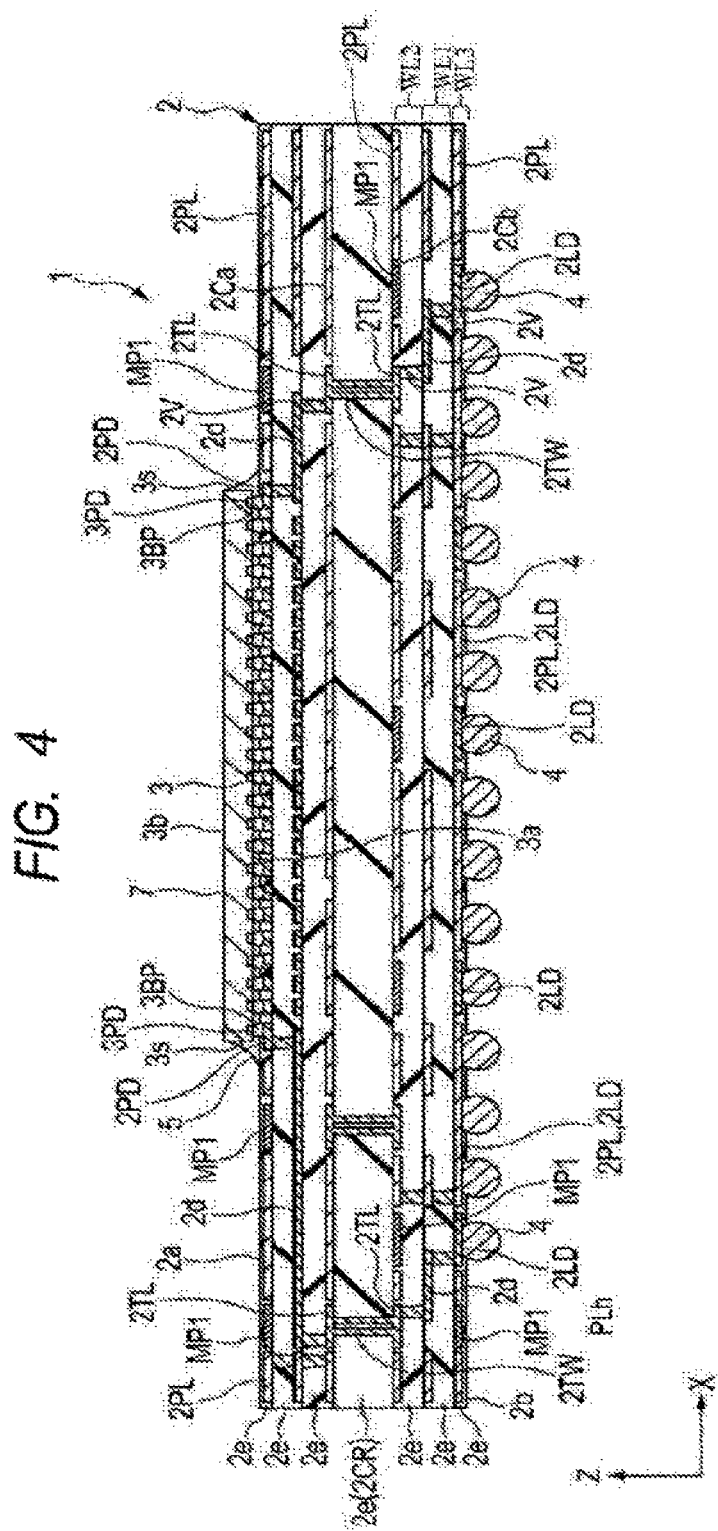
FIG. 4 is a cross-sectional view taken along the lines A-A of FIG. 1.

FIG. 1 is a perspective view of the semiconductor device of the present embodiment. FIG. 2 is a bottom view of the semiconductor device shown in FIG. 1. FIG. 3 is a perspective plan view showing the internal structure of the semiconductor device over the wiring substrate in a state with the heat sink removed. FIG. 4 is a cross-sectional view taken along the lines A-A of FIG. 1. In FIG. 1 through FIG. 4, the number of terminals is reduced to improve the visual understanding. In FIG. 4, the number of solder balls 4 is reduced more than in the example shown in FIG. 2 for better visual understanding. Though omitted from the drawings, the number of terminals (bonding pad 2PD, land 2LD, solder ball 4) can match a variety of modifications other than the states shown in FIG. 1 through FIG. 4.

<Semiconductor Device>

The overall structure of the semiconductor device 1 of the present embodiment is first of all described while referring to FIG. 1 through FIG. 4. The semiconductor device 1 of the present embodiment includes a wiring substrate 2, and a semiconductor chip 3 (see FIG. 4) mounted over the wiring substrate 2.

The wiring substrate 2 as shown in FIG. 4 is comprised of an upper surface (surface, main surface, first surface, chip mounting surface) 2a over which the semiconductor chip 3 is mounted, a lower surface (surface, main surface, second surface, mounting surface) 2b on the side opposite the upper surface 2a, and the plural side surfaces 2s (see FIG. 1 through FIG. 3) placed between the upper surface 2a and lower surface 2b, and that a formed in the external shape of a square as seen from a plan view as shown in FIG. 2 and FIG. 3.

The wiring substrate 2 is an interposer (relay substrate) for electrically coupling the semiconductor chip 3 mounted over the upper substrate 2a side and the mounting substrate not shown in the drawing; and is comprised of plural wiring layers (six layers in the example shown in FIG. 4) that electrically couples the lower surface 2b side serving as the mounting surface and the upper surface 2a side serving as the chip mounting surface. The wiring substrate 2 is for example formed by stacking in layers by the build-up technique for each of the plural wiring layers, over the upper surface 2Ca and lower surface 2Cb of the insulation layer (core layer, core material, core insulation layer) 2CR comprised of prepreg material in which resin is permeated into glass fibers. The wiring layer for the upper surface 2Ca side, and the wiring layer on the lower surface 2Cb side of the insulation layer 2CR, are electrically coupled by way of plural through hole wiring 2TW embedded in the plural through holes formed so as to penetrate from either one side to the other side of the upper surface 2Ca and lower surface 2Cb.

FIG. 4 shows a wiring substrate 2 containing an insulation layer 2CR which is a core layer as one example of a wiring substrate however a modification relative to FIG. 4 contains no core or in other words utilizes a so-called coreless substrate. In this case, no through hole wire 2TW is formed, and the wiring layer for the lower layer 2b side and the wiring layer for the upper layer 2a side are electrically coupled by way of plural via wires 2V for contact with each wiring layer.

Plural bonding pads (terminals, semiconductor chip coupling terminals) 2PD are formed over the upper surface 2a of the wiring substrate 2 for electrical coupling to the semiconductor chip 3. Plural lands (terminals, external terminals, external electrodes) 2LD serving as external input/output terminals for the semiconductor device 1 are formed over the lower surface 2b of the wiring substrate 2. The plural bonding pads 2PD and plural lands 2LD are each electrically coupled by way of the plural via wires 2V serving as the interlayer conduction path and the plural wires 2d formed in the wiring substrate 2. In the example shown in FIG. 4, an insulation layer 2CR serving as the core layer is contained over the wiring substrate 2. Therefore, the upper surface 2Ca side and the lower surface 2Cb side of the insulation layer 2CR are coupled by way of the through hole wire 2TW that conductors (for example, a metal such as copper) are embedded in a through hole formed so as to pass through from one side to the other of either the upper surface 2Ca and the lower surface 2Cb of the insulation layer 2CR. The structure of each wiring layer of the wiring substrate 2 is described in detail later on.

In the example in FIG. 4, solder balls (solder material, terminals, external terminals, electrodes, external electrodes) 4 are coupled to the respective plural lands 2LD. The solder balls 4 are a conductive material for electrically coupling the plural terminals on the mounting board side (omitted from drawing) to the plural lands 2LD, during mounting the semiconductor device 1 over a mounting board not shown in the drawing. The solder balls 4 are for example a solder material that is an Sn—Pb solder material containing lead (Pb) or not essentially containing lead or namely a solder material made from lead-free solder. Examples of lead-free solder are for example, tin (Sn) only, tin-bismuth (Sn—Bi), or tin-copper-silver (Sn—Cu—Ag), lead-copper (Sn—Cu), etc. Here, the term lead-free solder signifies a lead (Pb) content of 0.1 percent weight by volume and this content was established as a standard in the RoHS (Restriction on Hazardous Substances) directive.

The plural solder balls 4 as shown in FIG. 2 are placed in a matrix shape (array shape, matrix shape). Though omitted from the drawing in FIG. 2, the plural lands 2LD (see FIG. 4) where the plural solder balls 4 are joined are also positioned in a matrix shape. A semiconductor device where plural external terminals (solder ball 4, land 2LD) are placed in a matrix shape on the mounting surface side of the wiring substrate 2 is called an area array type semiconductor device. Area array type semiconductor devices are capable of effectively utilizing the mounting surface side (lower surface 2b) of the wiring substrate 2 as a space for placing the external terminal and so are preferable in the point that having to increase the mounting surface area of the semiconductor device can be prevented even if the number of external terminals is increased. In other words, semiconductor devices using an increasing number of external terminals according to high functionality and high integration can be mounted in space-saving.

In the examples shown in FIG. 1, FIG. 2, and FIG. 4 so-called BGA (Ball Grid Array) type semiconductor packages utilizing the solder balls 4 as external terminals were shown as examples, however there are a variety of modifications in the structure and the layout of the external terminals. For example in the lower surface 2b shown in FIG. 4, modifications may include a structure where plural lands 2LD are exposed or a structure joining thin solder material over plural lands 2LD that are exposed in the lower surface 2b. Semiconductor packages having these type of modifications are called LGA (Land Grid Array).

The semiconductor device 1 includes a semiconductor chip 3 mounted over the wiring substrate 2. As shown in FIG. 4, each of the semiconductor chips 3 contains a surface (main surface, upper surface) 3a, a rear surface (main surface, lower surface) 3b on the opposite side of the surface 3a, and a side surface 3s that is positioned between the surface 3a and the rear surface 3b. The semiconductor chip 3 as shown in FIG. 3 forms a square outer shape whose surface area is smaller than that of the wiring substrate 2 as seen from a plan view. In the example shown in FIG. 3, each of the four side surfaces 3s of the semiconductor chip 3 are mounted in the center section of the upper surface 2 of the wiring substrate 2 so as to extend along the respective four side surfaces 2s of the wiring substrate 2.

Plural pads (bonding pads) 3PD are formed over the surface 3a of the semiconductor chip 3 as shown in FIG. 4. In the present embodiment, plural pads 3PD are placed in a matrix shape (matrix shape, array shape) over the surface 3a of the semiconductor chip 3. Positioning the plural pads 3PD serving as electrodes for the semiconductor chip 3 in a matrix shape is preferable since the surface 3a of the semiconductor chip 3 can be efficiently utilized as a space for positioning the electrodes, so that having to increase the surface area can be prevented even if there is an increase in the number of electrodes for the semiconductor chip 3. Though not shown in the drawing, a modification of the present embodiment is capable of being applied to semiconductor chip types where plural pads are formed over the periphery of the surface 3a.

In the example shown in FIG. 4, the semiconductor chip 3 is mounted over the wiring substrate 2 in a state where the surface 3a is facing opposite the upper surface 2a of the wiring substrate 2. This type of mounting method is called the face down method or the flip chip method.

Though not shown in the drawings, plural semiconductor elements (circuit elements) are formed over the main surface (more specifically, a semiconductor element forming region formed over the element forming surface of the semiconductor substrate serving as the base material of the semiconductor chip 3) of the semiconductor chip 3. The plural pads 3PD are respectively electrically coupled to the plural semiconductor elements by way of the wiring (omitted from the drawing) formed over the wiring layer placed internally (more specifically, between the semiconductor element forming region not shown in the drawing and the surface 3a) in the semiconductor chip 3.

The semiconductor chip 3 (more specifically, base material of the semiconductor chip 3) is for example comprised of silicon (Si). Also, an insulating film is formed over the surface 3a so as to cover the wiring and the based material of the semiconductor chip 3. The respective surfaces of the plural pads 3PD are exposed from the insulating film by an aperture formed in that insulating film. The plural pads 3PD are respectively comprised of metal and in the present embodiment are comprised for example from aluminum (Al).

As shown in FIG. 4, the plural pads 3PD of the semiconductor chip 3 to which the projecting electrodes 3BP are respectively coupled, and the plural pads 3PD of the semiconductor chip 3 are respectively electrically coupled by way of the plural projecting electrodes 3BP to the plural bonding pads 2PD of the wiring substrate 2. The projecting electrodes 3BP are a metal member formed so as to protrude over the surface 3a of the semiconductor chip 3. The projecting electrode 3BP in the present embodiment is a so-called solder bump where solder material is stacked over the pad 3PD by way of an under-layer metal film (under-bump metal). This under-layer metal film can for example be exemplified as a laminated film in which for example titanium (Ti), copper (Cu), nickel (Ni) (in some cases a film of gold (Au) if further formed over a film of nickel) are stacked in layers from the side coupled to the pads 3PD. The solder material comprising the solder bump may for example utilize solder material containing lead or utilizing lead-free solder the same as for the above described solder ball 4. When mounting the semiconductor chip 3 over the wiring substrate 2, a solder bump may be formed beforehand over both the plural pads 3PD and the plural bonding pads 2PD, and heat treatment (reflow soldering) performed in a state where the solder bumps are in contact with each other forms the projecting electrodes 3BP by integrating the solder bumps. In one modification of the present embodiment, a pillar bump comprised of a solder film on the leading edge of the conducting column comprised from copper (Cu) and nickel (Ni) may be utilized as the projecting electrode 3BP.

Also as shown in FIG. 4, an underfill resin (insulating resin) 5 is deposited between the wiring substrate 2 and the semiconductor chip 3. The underfill resin 5 is deposited so as to block the space between the substrate 3a of the semiconductor chip 3 and the upper surface 2a of the wiring substrate 2. The underfill resin 5 is comprised of insulating (non-conductive) material (such as resin material) and is deposited so as to seal the electrical coupling section (joint of the plural projecting electrodes 3BP) of the wiring substrate 2 and the semiconductor chip 3. By depositing the underfill resin 5 in this way so as to seal the coupling section of the plural projecting electrodes 3BP, the strain occurring in the electrical coupling section of the semiconductor chip 3 and the wiring substrate 2 can be alleviated.

<Wiring Structure of Signal Transmission Path>

Figure 5:
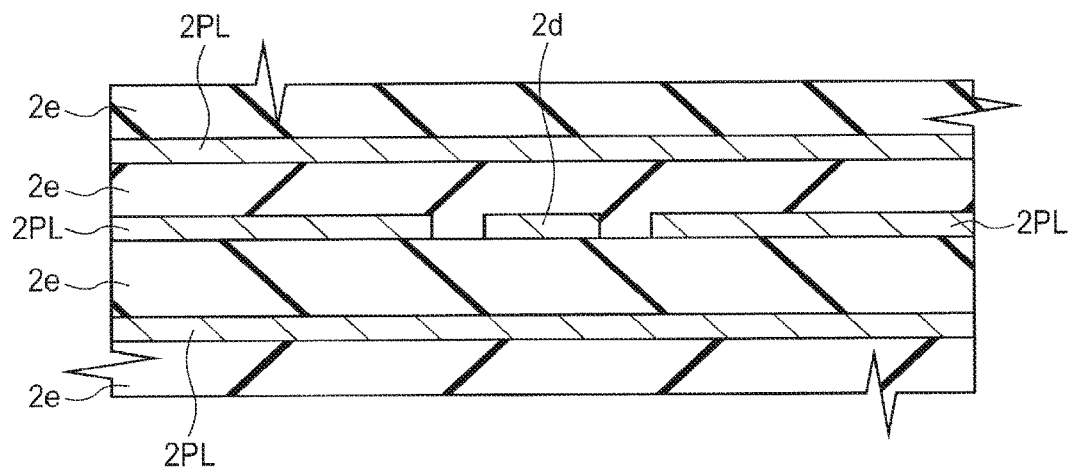
FIG. 5 is an enlarged cross-sectional view showing an example of the wiring structure of the stripline.
Figure 6:
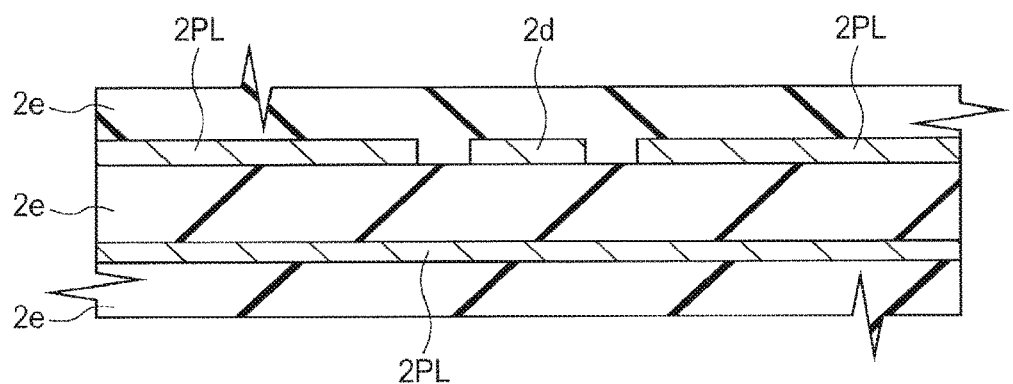
FIG. 6 is an enlarged cross-sectional view showing an example of the wiring structure of the microstrip line.
Figure 7:
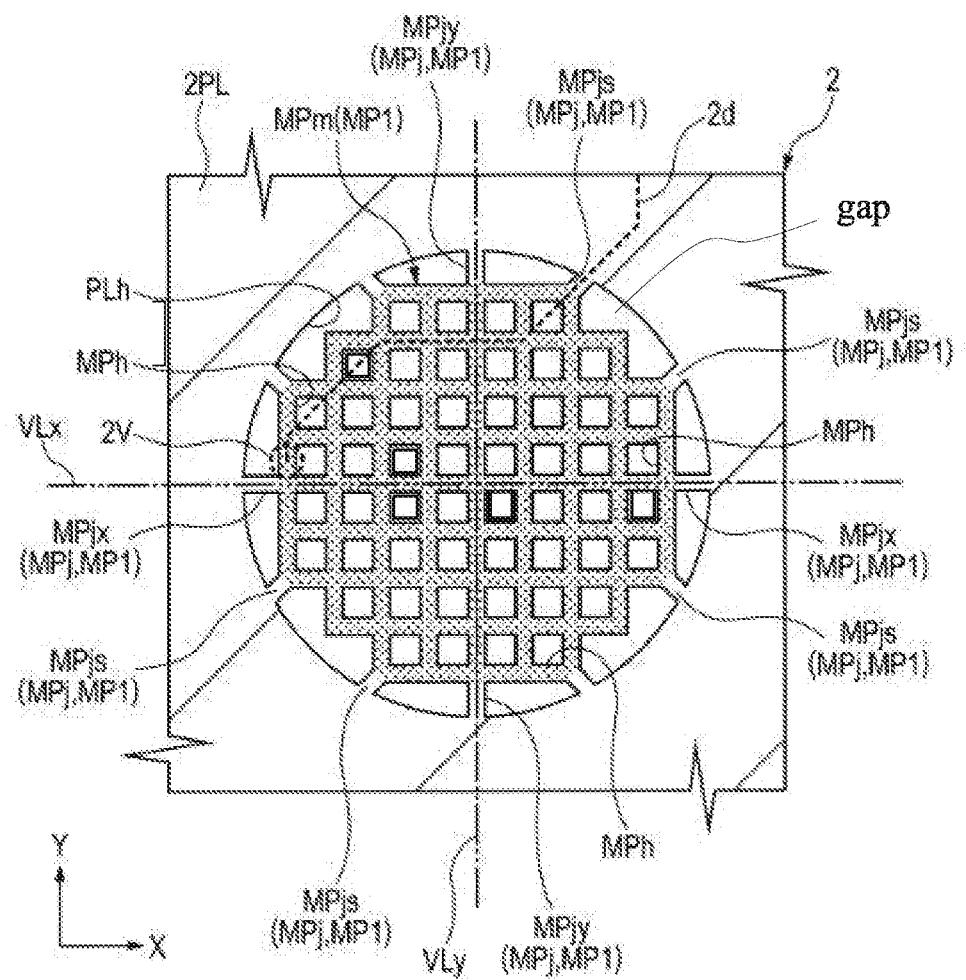
FIG. 7 is an enlarged plan view showing an example of the planar shape of the conductor pattern serving as the electromagnetic wave absorber.
Figure 8:
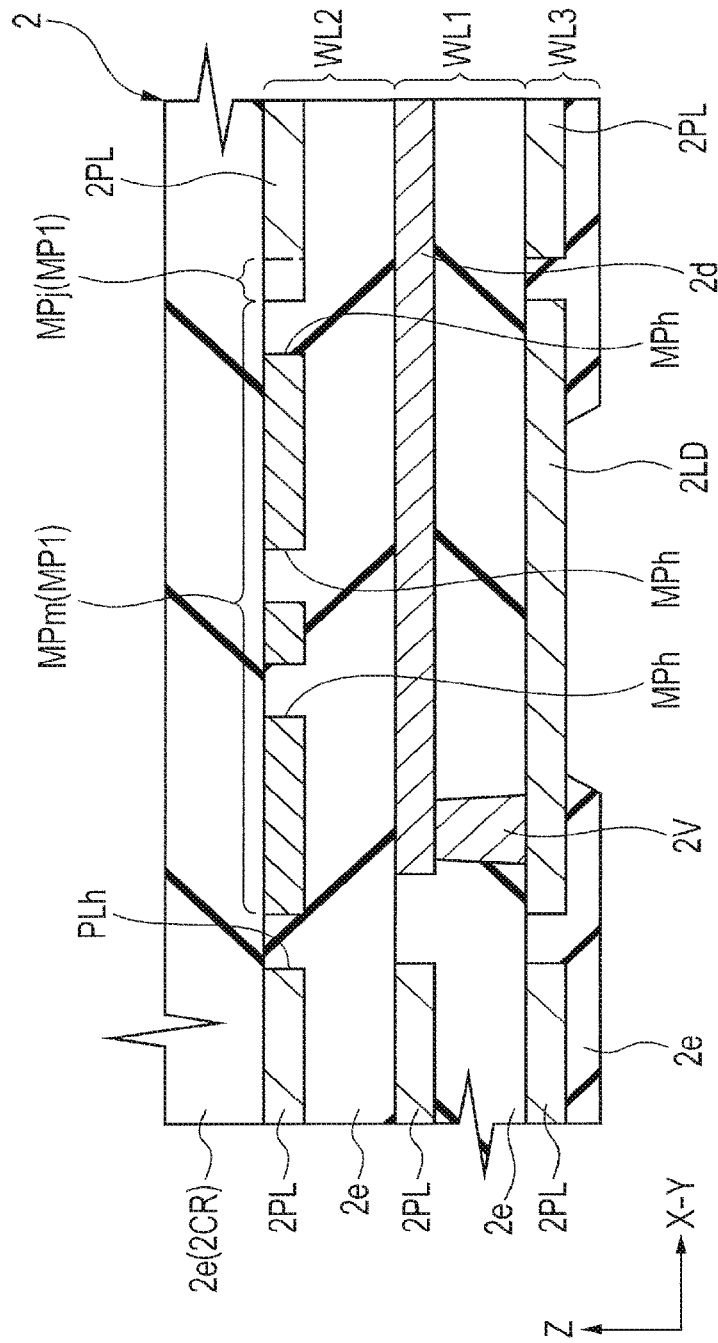
FIG. 8 is an enlarged cross-sectional view taken along the wire extension direction shown by the dotted lines in FIG. 7.

The wiring structure of the signal transmission path among the wiring substrates 2 that are shown in FIG. 1 through FIG. 4 are described next. FIG. 5 is an enlarged cross-sectional view showing an example of the wiring structure of the stripline. FIG. 6 is an enlarged cross-sectional view showing an example of the wiring structure of the microstrip line. FIG. 7 is an enlarged plan view showing an example of the planar shape of the conductor pattern serving as the electromagnetic wave absorber. FIG. 8 is an enlarged cross-sectional view taken along the wire extension direction shown by the dotted lines in FIG. 7.

In FIG. 7, even though a plan view, hatching is applied to the conductor plane 2PL, and a dot pattern is applied to the main pattern section MPm of the conductor pattern MP1 in order to easily distinguish each structural section of the electromagnetic wave absorber from the conductor plane 2PL on the periphery of the electromagnetic wave absorber. Also in FIG. 7, in order to clearly show the planar positional relation of the electromagnetic wave absorber and the wire 2d formed in another wiring layer separate from the electromagnetic wave absorber, an example of the layout of the wiring 2d configuring the signal transmission path is shown by a dotted line. Moreover, the solder ball 4 shown in FIG. 4 is omitted in FIG. 8 to make the drawing easier to view and understand.

The plural transmission paths in the wiring substrate 2 of the present embodiment include for example transmission paths (high-speed transmission paths) for transmission of signals at transmission speeds for example of approximately 10 Gbps (Gigabit per second) to 25 Gbps. To achieve a high transmission speed along this type of signal transmission path, the widening of the electrical fields and the widening of the electromagnetic fields to the periphery of the signal transmission path is preferably suppressed in view of the need for better noise immunity along the signal transmission path. Restated in other words, suppressing the scattering of electromagnetic waves that are generated in the signal transmission path can improve the noise immunity of signal transmission path.

A wiring structure to suppress the widening of electrical fields or magnetic fields to the periphery of the signal transmission path is a technology as shown in FIG. 5 and FIG. 6 that forms a conductor plane (conductor plate) 2PL serving as the metallic film that is formed in a plate shape so as to overlap the wire 2d serving as the signal transmission path in the thickness direction and that supplies a standard electrical potential such as a ground potential to the conductor plane 2PL.

In the example of a wiring structure shown in FIG. 5, a conductor plane 2PL serving as the metal film in a plate shape is respectively formed in the upper wiring layer for the wire 2d, and the lower wiring layer for the wire 2d. Restated in other words, as seen from a side view, the wire 2d is enclosed between the conductor plane 2PL formed in the upper wiring layer, and the conductor plane formed in the lower wiring layer. Moreover, a conductor plane 2PL is formed in the wiring layer of the same layer as the wire 2d so as to be isolated from the wire 2d and the area around the wire 2d is enclosed by the conductor plane 2PL. The wiring structure shown in FIG. 5 is called a stripline.

In the example of a wiring structure shown in FIG. 6 on the other hand, a conductor plane 2PL is placed in a lower layer of a wiring layer for the wire 2d. Also, a conductor plane 2PL is formed in the wiring layer of the same layer as the wire 2d so as to be isolated from the wire 2d and the periphery of the wire 2d is enclosed by the conductor plane 2PL. However, in the wiring structure shown in FIG. 6, the wire 2d is formed in the uppermost layer of the wiring layer, so that the conductor plane 2PL is not formed over the upper layer of the wire 2d. The wiring structure shown in FIG. 6 is called a microstrip line.

In the case of the microstrip line shown in FIG. 6, the conductor plane 2PL is formed below the wire 2d at a position overlapped with the wire 2d in the thickness direction. An electrical field and an electromagnetic field are therefore not prone to easily widen below the wire 2d. Also, the conductor plane 2PL is formed so as to be isolated from the wire 2d in the wiring layer of the same layer as the wire 2d, and the periphery of the wire 2d is enclosed by the conductor plane 2PL. An electrical field and an electromagnetic field are therefore not likely to widen in the periphery of the wire 2d as seen from a plan view. However, there is no conductor plane 2PL formed upwards of the wire 2d so an electrical field and an electromagnetic field is therefore more likely to widen upwards of the wire 2d compared to downwards of the wire 2d. Therefore there is greater susceptibility to effects of dispersion of electromagnetic waves or effects from noise propagation from other wires mounted in that vicinity compared to the microstrip line shown in FIG. 5.

Therefore, on paths for propagating signals at high speed, the wire structure for the strip line shown in FIG. 5 is superior to the wire structure for the microstrip line shown in FIG. 6.

However in the wiring substrate 2 as shown in FIG. 4, the plural stacked wiring layers are electrically coupled, and the upper surface 2a side and lower surface 2b side are electrically coupled. Applying a stripline structure for all sections of the transmission path is therefore difficult and the transmission path also includes section where the wiring structure is subject to fluctuations. An example of a section subject to fluctuations in the wiring structure is the section for the via wire 2V electrically coupled between the adjacent wiring layers. The section coupling the land 2LD and the wire 2d that is a portion of the signal transmission path and the section coupling the through hole land 2TL and the wire 2d are particularly prone to generate large signal reflections in the coupling section for the via wire 2V. Electromagnetic wave scattering (or dispersal) caused by the signal reflections therefore easily tends to occur.

Another example of a fluctuation in the wiring structure can be found in sections for example where the structure is changed from a stripline to a microstrip line or in section where the structure is changed from a microstrip line to a stripline.

Here, scattering of electromagnetic waves progressing along the transmission path tends to easily occur in sections where the wiring structure is changed. When a portion of these scattered electromagnetic return in the direction from which they originally came (or in other words, when a signal reflection occurs), the section where there is a change in the wiring structure along the transmission path is observed as a section of the impedance discontinuity. Therefore technology to render the section with the impedance discontinuity ineffective is required in order to improve the reliability of the semiconductor device containing signal transmission paths for transmitting electrical signals at high speed.

As described above, there is a method that adds an inverse impedance discontinuity in the opposite direction in order to cancel out the section with the impedance discontinuity. However, when utilizing this method, the impedance cannot be canceled out when the frequency of the signal becomes high and in some cases renders the effect of two impedance discontinuities.

In order to cancel out capacitive impedance discontinuities another method forms an aperture section over the conductor pattern (conductor plane 2PL) of another layer covering the section where the impedance discontinuity occurs to suppress capacitive coupling. However in the case of this method, the distance between the signal transmission path and the return path (reflux current path) corresponding to the signal transmission path is isolated at localized sections so that the target section is easily susceptible to inductive crosstalk noise.

Whereupon, the present inventors made a study of technology for high-speed transmission paths that effectively renders impedance discontinuities ineffective. The present inventors consequently took notice of the fact that impedance discontinuities and signal reflections have the following relationship. Namely, rather than signal reflections occurring because there are impedance discontinuities, the present inventors found that a portion of the scattered electromagnetic waves are observed as impedance discontinuities due to returning in the direction that they originally came. In view of this fact, the present inventors took note of the fact that if the scattered electromagnetic waves could be eliminated, then the impedance discontinuities can be rendered ineffective regardless of the sign (capacitive, inductive) of the impedance discontinuity.

In the present embodiment, an electromagnetic wave absorber capable of eliminating the scattered electromagnetic waves by converting the scattered electromagnetic waves into heat energy is mounted in the section where the impedance discontinuity is observed or in other words, at a position overlapped with the section where the wiring structure changes in the thickness direction along the signal transmission path. The electromagnetic wave absorber is comprised of a conductor of metal, etc.

In the examples shown in FIG. 7 and FIG. 8, the conductor pattern (metallic pattern) MP1 serving as the electromagnetic wave absorber is formed within the aperture section PLh formed over the conductor plane 2PL as seen from a plan view. The conductor plane 2PL is for example a ground plane (conductor plate for supplying a standard electric potential) that supplies the standard electric potential (GND); and the aperture section PLh shown in FIG. 8 is formed so as to penetrate through in the thickness direction of the conductor plane 2PL. Also, the conductor pattern MP1 is comprised of the main pattern section (mesh pattern section) MPm isolated from the conductor plane 2PL, and the plural coupling sections MPj joining the main pattern section m and the coupling sections MPj. The main pattern section MPm and the coupling sections MPj are respectively formed from the metal material (for example utilizing copper as the main element) same as the conductor plane 2PL.

When signals are sent (signal current flows) in the wire 2d which is part of the signal transmission path, the electromagnetic waves scatter towards the periphery of the wire 2d. A current flows in the main pattern section MPm when the electromagnetic waves that are generated along the signal transmission path on the main pattern section MPm of the conductor pattern MP1 then arrive. If the frequency band of the signal transmission path or in other words the frequency band utilized by the signal transmission path is high-frequency waves, the skin effect causes a high conduction resistance in the main pattern section MPm. The electrical energy is therefore converted into heat energy and at least a portion of the electromagnetic wave is eliminated. In other words, the conductor pattern MP1 functions as an electromagnetic wave absorber that eliminates at least a portion of the electromagnetic wave by Joule conversion.

In another aspect separate from the main pattern section MPm shown in FIG. 7, when a current flows due to electromagnetic waves, a portion of the electromagnetic wave can be eliminated even for example by a conductor pattern shaped as a plane circle not shown in the drawing rather than plural aperture sections MPh formed in a mesh shape. However, the surface area of the main pattern section MPm is preferably large from the standpoint of improving efficiency when converting electromagnetic wave energy into heat energy. The main pattern section MPm of the conductor pattern MP1 of the present embodiment is therefore preferably a mesh pattern having plural aperture sections MPh at systematic intervals.

If only considering the function as an electromagnetic wave absorber then just as with the conductor pattern MP1, there is no need to couple the conductor plane 2PL and the main pattern section MPm. However, in this aspect just as is described later on, a portion of the electromagnetic wave absorber can be utilized as the return path for the signal transmission path. The conductor plane 2PL and the main pattern section MPm are therefore electrically coupled by way of a coupling section MPj. Also if the conductor plane 2PL and the main pattern section MPm are electrically coupled, the voltage potential of the conductor pattern MP1 serving as the electromagnetic wave absorber, is stabilized to the same electric potential (for example, ground potential) as the conductor plane 2PL electric potential.

The electromagnetic wave absorber here is formed with the objective of suppressing the scattering of electromagnetic waves along the signal transmission path and so is formed at a position overlapped with the section of the wire 2d forming the signal transmission path in the thickness direction as shown in FIG. 8. The conductor plane 2PL is a ground plane supplied with a standard electric potential (for example ground potential) as already described, and is one section of the return path corresponding to the signal transmission path. The electromagnetic wave absorber is formed within the aperture section PLh of the conductor plane 2PL as shown in FIG. 7 so that if the conductor plane 2PL is not electrically coupled to the electromagnetic wave absorber, the return path corresponding to the signal transmission path can bypass the periphery of the aperture section PLh. In other words, the gap distance between the signal transmission path and the return path becomes wider in some sections.

Reducing and also setting a fixed gap distance between the signal transmission path and the return path is preferable from the standpoint of reducing crosstalk noise among the plural signal transmission paths. However, when the return path detours along the periphery of the aperture section PLH formed over the conductor plain 2PL as described above, then the gap distance between the signal transmission path and return path becomes large in certain sections. Consequently, effects from crosstalk noise are easily prone to occur at points where the gap distance is large. Restated, crosstalk noise immunity decreases in certain sections if the electromagnetic wave absorber and conductor plane 2PL are not coupled each other. Whereupon, the present inventors made a further investigation of technology for utilizing a portion of the electromagnetic wave absorber as the return path and discovered the structure of the present embodiment.

In the present embodiment as shown in FIG. 7 and FIG. 8, the conductor pattern MP1 serving as the electromagnetic wave absorber is electrically coupled to the conductor plane 2PL serving as the ground plane that is the return path corresponding to the signal transmission path. A portion of the conductor pattern MP1 serving as the electromagnetic wave absorber can in this way be utilized as the return path corresponding to the signal transmission path.

The main pattern section MPm for the conductor pattern MP1 as shown in FIG. 7 is formed in a mesh pattern where the plural aperture sections MPh are periodically positioned. Each of the aperture sections MPh are through holes penetrating through the metal film configuring the conductor pattern MP1 in the thickness direction. In the example shown in FIG. 7 the through holes are arrayed in a grid shape. Making a mesh pattern over the planar shape of the main pattern section MPm in this way forms the return path along the mesh pattern. A return path can therefore be formed along the direction that the wire 2d extends regardless of the layout of the wire 2d that is formed at a position overlapped with the conductor pattern MP1 in the thickness direction.

Also in the present embodiment, plural coupling sections MPj are formed that link the conductor plane 2PL with the main pattern section MPm. Therefore, a wire 2d can be formed along the coupling section MPj, if any or any one of the plural coupling sections MPj is formed in the vicinity of the wire 2d as seen from a plan view. In the example shown in FIG. 7, one among the plural coupling sections MPj of the conductor pattern MP1 is overlapping the wire 2d in the thickness direction as seen from a plan view. In this plan view, the coupling section MPj that is placed nearest the wire 2d then forms a return path corresponding to the signal transmission path. In the example shown in FIG. 7, one among the plural coupling sections MPj is overlapping the wire 2d so that this coupling section MPj forms a return path.

The present embodiment is in other words capable of suppressing electromagnetic wave scattering in sections where impedance discontinuities are observed by way of an electromagnetic wave absorber and also capable of preventing the signal transmission path and return path from separating away from each other at certain points by utilizing a portion of the electromagnetic wave absorber as the return path. Also, if the electromagnetic wave absorber can be utilized as the return path, there are no restrictions on the wiring layout for forming the electromagnetic wave absorber so that many electromagnetic wave absorbers can be formed in the wiring substrate 2. The noise immunity of the semiconductor device 1 shown in FIG. 4 can consequently be improved.

The following can be considered from the standpoint of improving the degree of freedom in wiring layout design in the present embodiment. Namely, in the present embodiment, a conductor pattern MP1 containing a main pattern section MPm serving as the mesh pattern in a planar shape is placed at a position overlapped with a portion of the wire 2d in the thickness direction, and moreover is electrically coupled to the conductor plane 2PL. Therefore, a return path can therefore be formed along the direction that the wire 2d extends regardless of the layout of the wire 2d so that the degree of freedom in designing (or laying out) the wire 2d can be improved.

The expression, forming a return path along the direction that the wire 2d (namely the signal transmission path) extends also includes the case where the wire 2d and the overall return path overlap in the thickness direction at a position overlapped with the aperture section PLh and also includes the following cases.

In the examples shown in FIG. 7 and FIG. 8, the planar shape of the wire 2d within the aperture section PLh and the mesh pattern (grid pattern) of the main pattern section MPm of the conductor pattern MP1 are not a complete match, and there is a section where the aperture sections MPh and the wire 2d overlap. Restated in other words, there is a section where the position of the wire 2d and the position of the conductor pattern MP1 forming the return path deviate as seen from a plan view.

However, the main pattern section MPm is a mesh pattern so the return path is formed along the mesh pattern. Therefore, if the diameters of the respective aperture sections MPh in the mesh pattern could be made smaller, the amount of deviation between the return path and wire $2d$ could be reduced. An evaluation by the present inventors, that the amount of deviation (or offset) between the return path and the wire $2d$ (signal transmission path) is dependent on the return loss characteristics that is requested but is preferably 50 μm or lower.

The planar shape of the aperture section MPh shown in the example in FIG. 7 is a quadrangle; and the length of one side of the aperture section MPh is for example a square of approximately 30 μm to 200 μm. There are various modifications in the size and planar shape of the aperture section MPh. The shape of the aperture section MPh for example may be a circle, a square, or even a polygon. The planar shape of the aperture section MPh may be a shape other than a regular polygon or regular (perfect) circle (for example, an oval or rectangular shape, etc.). However, the size of the aperture must be reduced as the operating frequency becomes higher.

One among the plural coupling sections MPj over the conductor pattern MP1 as seen from a plan view in the example shown in FIG. 7 is overlapping the wire $2d$ in the thickness direction. However, as described above, even if there is a deviation between the position of the wire $2d$ and the position of the conductor pattern MP1 (for example, coupling section MDj) serving as the return path as seen from a plan view, the crosstalk noise can be reduced if the amount of deviation (or offset) is small.

In the present embodiment, the amount of deviation between the coupling section MPj and the wire $2d$ can be reduced even if using an optional wire $2d$ layout design, so that plural coupling sections MPj are positioned at approximately the same gap distance from each other. In the example shown in FIG. 7, the plural coupling sections MPj contain two coupling sections MPjx that are positioned so as to enclose the main pattern section MPm, along the virtual line VLx passing through the center of the aperture section PLh along the X direction. Also the plural coupling sections MPj contain two coupling sections MPjy that are positioned so as to enclose the main pattern section MPm, along the virtual line VLy passing through the center of the aperture section PLh along the Y direction that intersects the x direction. Also, among the two coupling sections MPjx and the two coupling sections MPjy, two coupling sections MPjs are placed between the respective adjacent coupling sections MPjx and coupling section MPjy. Each coupling section MPj is placed so as to align the mutual gap distances (so as to be approximately the same).

The number of coupling sections MPjs placed between the coupling section MPjx and the coupling section MPjy can be applied to a variety of modifications according to the size of the aperture section PLh. If for example the aperture area of the aperture section PLh is sufficiently small, the coupling sections MPjs need not be placed if the offset or deviation amount is within the tolerance range wherever the wire $2d$ is positioned between the coupling section MPjx and the coupling section MPjy. Also for example if one coupling section MPjs is positioned between the coupling section MPjx and the coupling section MPjy, one coupling section MPjs may be placed in the case that the deviation or offset amount of the wire $2d$ is within the tolerance range. Moreover, if the aperture area of the aperture section PLh is large, three or more coupling sections MPjs may be placed between the coupling section MPjx and the coupling section MPjy. However, from the standpoint of improving the degree of freedom for the wire $2d$ layout design, the planar shape of the conductor pattern MP1 is preferably point symmetric with the center of the aperture section PLh even if a number of coupling sections MPjs are placed.

As shown in FIG. 7, each of the plural coupling sections MPjs extends at a 45 degree slope in the X direction and the Y direction. By arranging the direction that the coupling section MPjs extends at a 45 degree slope in the X direction and Y direction, the gap distance between the plural coupling sections MPjs can be easily aligned. Also in designing the wire layout, the wire is in many cases laid out with the two axes serving as the reference (for example X axis and Y axis) and a third axis with a 45 degree slope in combination with the two axes serving as the reference. The wire $2d$ that forms the signal transmission path such as shown in FIG. 7 for example, contains plural bends, and the bend angles are multiple of 45 degrees (angles in section less than 180 degrees are any among 45 degrees, 90 degrees, or 135 degrees). Therefore, the directions that the wire $2d$ extends and the direction that the coupling section MPjs extends are easy to align, when the direction that the coupling section MPjs extends is at a 45 degree slope relative to the X direction and the Y direction as shown in FIG. 7.

<Position for Placing the Electromagnetic Wave Absorber>

Figure 9:
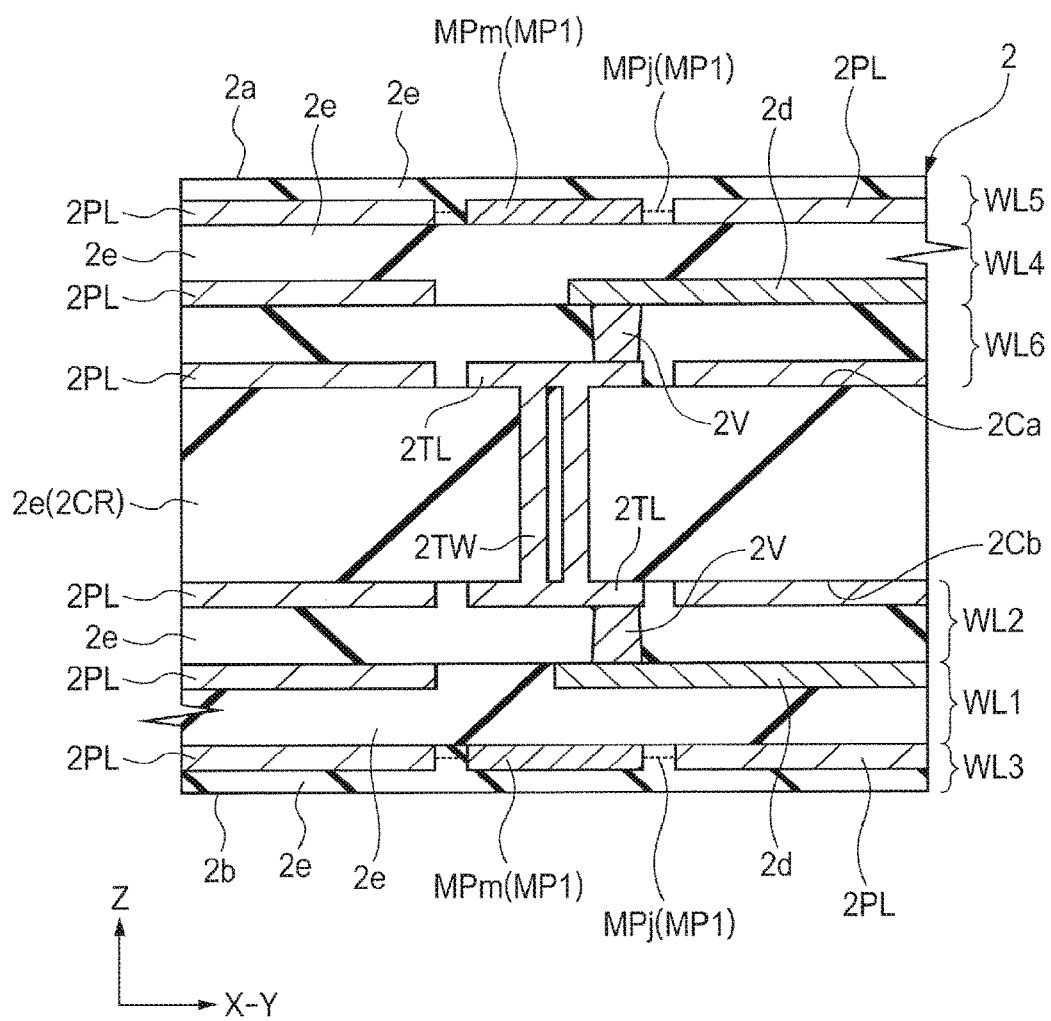
FIG. 9 is an enlarged cross-sectional view for a position different from FIG. 8.
Figure 10:
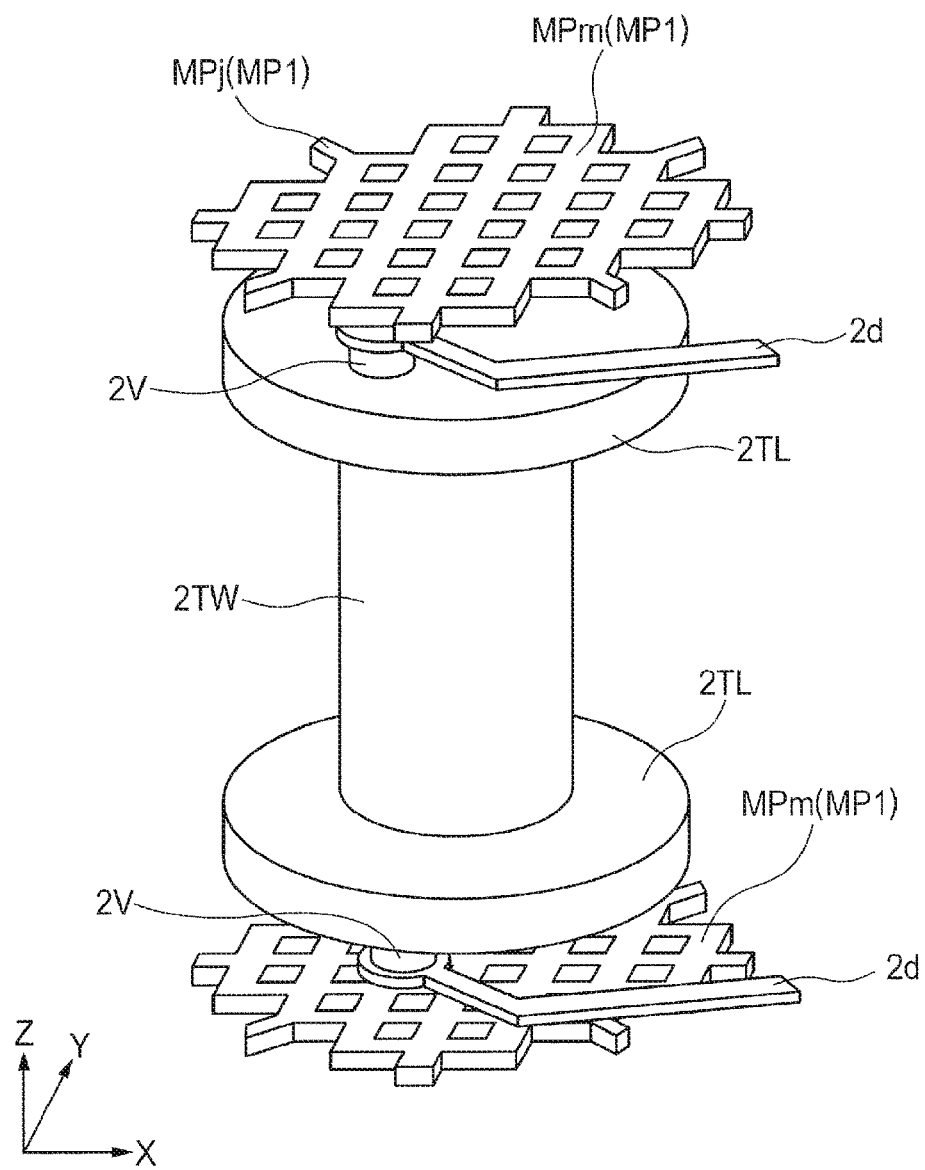
FIG. 10 is an enlarged perspective view showing the essential structure of the conductor pattern for the enlarged view in FIG. 9.
Figure 11:
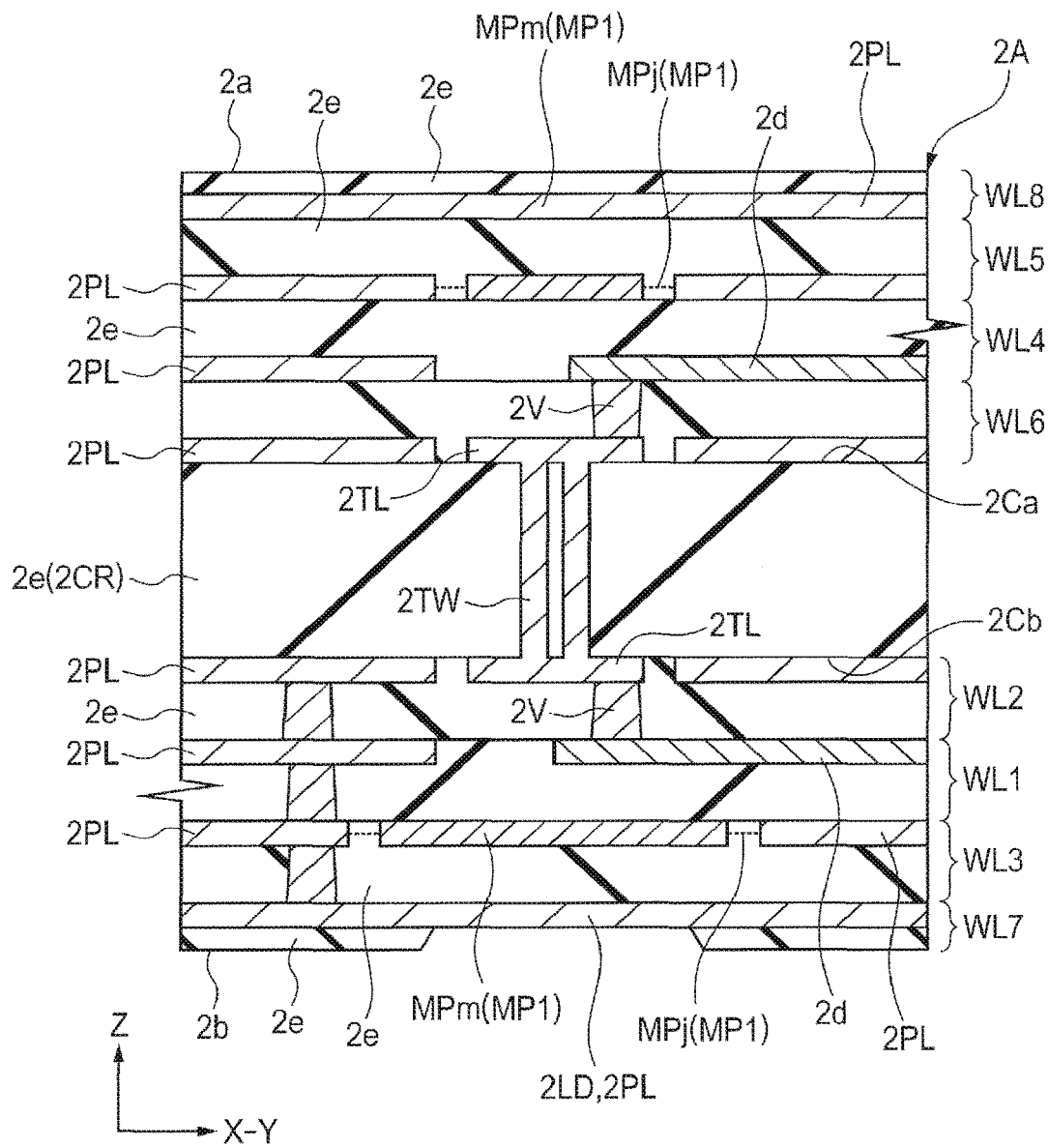
FIG. 11 is an enlarged cross-sectional view showing a modification corresponding to FIG. 9.

The position for placing the conductor pattern MP1 serving as the electromagnetic wave absorber described in FIG. 7 and FIG. 8 is described next. FIG. 9 is an enlarged cross-sectional view for a position different from FIG. 8. FIG. 10 is an enlarged cross-sectional view showing the essential structure of the conductor pattern for the enlarged cross-sectional view in FIG. 9. FIG. 11 is an enlarged cross-sectional view showing the modification corresponding to FIG. 9.

In FIG. 9 and FIG. 11, the section where the main pattern section MPm of the conductor pattern MP1 is shown by applying hatching, and the plural aperture sections formed over the conductor pattern MP1 are not shown in the drawings. Also in FIG. 9 and FIG. 11, the coupling section MPj is shown by a dotted line in order to diagrammatically show that the main pattern section MPm of the conductor pattern MP1 and the conductor plane 2PL are electrically coupled. The conductor plane 2PL coupled to the conductor plane MP1 is omitted from the drawing to make the drawing easier to understand visually.

The conductor plane serving as the electromagnetic wave absorber is formed in sections where the wiring structure changes as already described. In the example in FIG. 8, the conductor pattern MP1 is formed at a position overlapped with the land 2LD in the thickness direction.

In the example shown in FIG. 8, the wiring substrate 2 includes the wiring layer WL1 where the wire $2d$ serving as the signal transmission path, the wiring layer WL2 that is adjacent to the upper layer side (chip mounting surface side) of the wiring layer WL1 and the conductor pattern MP1 is formed, and the wiring layer WL3 that is adjacent to the lower layer side (mounting surface side) of the wiring layer WL1 and the signal transmission path is formed. The wire $2d$ and the land 2LD are electrically coupled by way of the via wires 2V serving as the inter layer conduction path. The land 2LD is an external terminal of the semiconductor device 1 (See FIG. 4) and is coupled to the solder ball (See FIG. 4) so that the width of the land must be prepared so as to be sufficiently larger than the wire $2d$.

In FIG. 8, when signals are sent to the wire $2d$ (signal current is flowing), and the frequency of the signal is sufficiently high, a large signal reflection occurs at the coupling section for the via wire 2V that electrically couples the land 2LD and the wire 2d so that a scattered electromagnetic wave occurs. Signal reflection tends to easily occur in sections that electrically couple the wire 2d that is formed into a narrow wire shape, and land 2LD that is a metal pattern whose width is sufficiently larger than the wire 2d, rather than in sections coupling the wires 2d together. When these scattered electromagnetic waves widen outwards, the transmission performance along the signal transmission path deteriorates. Whereupon in the present embodiment, a conductor pattern MP1 is formed at a position overlapped with the land 2LD in the thickness direction, and a wire 2d to transfer signals (signal current flows) is placed between the conductor pattern MP1 and the land 2LD. Moreover, in the example shown in FIG. 6, the via wire 2V is formed between the land 2LD and the conductor pattern MP1 (in other words, at a position overlapped with the land 2LD and the conductor pattern MP1 in the thickness direction).

In this way, at least a portion of the scattered electromagnetic waves emitted in the sections where the wiring structure changes are trapped by the conductor pattern MP1, and eliminated by conversion to heat energy. From the standpoint of easily trapping scattered electromagnetic waves, the aperture diameter (length of one side, when the planar shape is a quadrangle) of the aperture section MPh, is preferably smaller than the wavelength of the electromagnetic waves corresponding to the signal band of the signal that is sent. Also, the aperture diameter (length of one side, when the planar shape is a quadrangle) of the aperture section MPh is in particular preferably $1/20^{th}$ or less than the wavelength of the above described electromagnetic waves.

Also in the present embodiment, in the wiring layer WL2 the conductor plane MP1 and the conductor plane 2PL are electrically coupled by way of the plural coupling sections MPj (See FIG. 7) so that the gap distance between the signal transmission path and the return path gap can be maintained at a fixed distance. Therefore, crosstalk noise occurring due to the distance in local sections between the signal transmission path and the return path can in this way be prevented.

In the examples shown in FIG. 7 and FIG. 8, the conductor pattern MP1 is described as formed at a position overlapped with the land 2LD. However, there are other sections having changes in the wire structure. For example when the plural insulation layer 2e in the wiring substrate 2e contains an insulation layer (core layer, core insulation layer) 2CR made from prepeg material as shown in FIG. 9, the through hole wire 2TW electrically coupling the upper surface 2Ca and the lower surface 2Cb of the insulation layer 2e, is coupled to the through hole land 2TL having a larger width (diameter) than the wire 2d.

In the example shown in FIG. 9, on the lower surface 2Cb side of the insulation layer 2CR serving as the core layer; the wiring substrate 2 includes the wiring layer WL1 where the wire 2d serving as the signal transmission path is formed, the wiring layer WL2 that is adjacent to the lower side (mounting surface side) of the wire layer WL1 and where the conductor pattern MP1 is formed, and a wiring layer WL3 that is adjacent to the upper layer side (chip mounting surface side) of the wiring layer WL1 and where a through hole land 2TL is formed. On the upper surface 2Ca side of the insulation layer 2CR serving as the core layer, the wiring substrate 2 includes the wiring layer WL4 where the wire 2d serving as the signal transmission path is formed, the wiring layer WL5 that is adjacent to the upper layer side (chip mounting surface side) of the wiring layer WL4 and where the conductor pattern MP1 is formed, and a wiring layer WL6 that is adjacent to the lower layer side (mounting surface side) of the wiring layer WL4 and where the through hole land 2TL is formed.

The through hole land 2TL is for example a planar shape having a circular conductor pattern. The diameter (width) of the through hole land 2TL is a smaller than the diameter of the land 2LD shown in FIG. 8 but larger than the width of the wire 2d. The insulation layer 2CR serving as the core layer is comparatively hard in comparison to the other insulation layers (build-up layers) formed by the build-up technique and has a large thickness so the diameter of the through hole wire 2TW is larger than the diameter of the via wire 2V formed in the built-up layer. Therefore, the width of the through hole land 2TL formed at both ends of the through hole wire 2TW is larger than the diameter of the width of the wire 2d and the via wire 2V.

In FIG. 9, when signals are sent to the wire 2d (signal current is flowing), and the frequency of the signal is sufficiently high, signal reflection occurs at the coupling section for the via wire 2V that electrically couples the through hole land 2TL and wire 2d so that scattered electromagnetic wave occurs. Signal reflection occurs respectively at the upper surface 2Ca side and the lower surface 2Cb side of the insulation layer 2CR serving as the core layer.

Whereupon in the present embodiment, the conductor patterns MP1 are respectively formed at a position overlapped with the through hole land 2TL in the thickness direction, and a wire 2d to transmit signals (signal current flows) is placed between the conductor pattern MP1 and the through hole land 2TL. Moreover, in the example shown in FIG. 9, the via wire 2V is formed between the through hole land 2TL and the conductor pattern MP1 (in other words, at a position overlapped with the through hole land 2TL and the conductor pattern MP1 in the thickness direction).

In this way, at least a portion of the scattered electromagnetic waves emitted at the coupling section for the via wire 2V that electrically couples the through hole land 2TL and wire 2d is trapped by the conductor pattern MP1, and eliminated by conversion to heat energy. The preferred shape of the conductor pattern MP1 is the same as previously described using FIG. 7 and FIG. 8 so a redundant description is omitted.

In the example shown in FIG. 9 however, a wiring layer WL3 where the conductor pattern MP1 is formed; and a wiring layer WL3 where a land 2LD is formed as shown in FIG. 8 so that in some cases the wiring layer 3 cannot be formed due to the position of the land 2LD. In such cases, placement priority is given to the land 2LD (See FIG. 8) and the conductor pattern MP1 is formed at sections not overlapping the land 2LD and the through hold land 2T.

Figure 12:
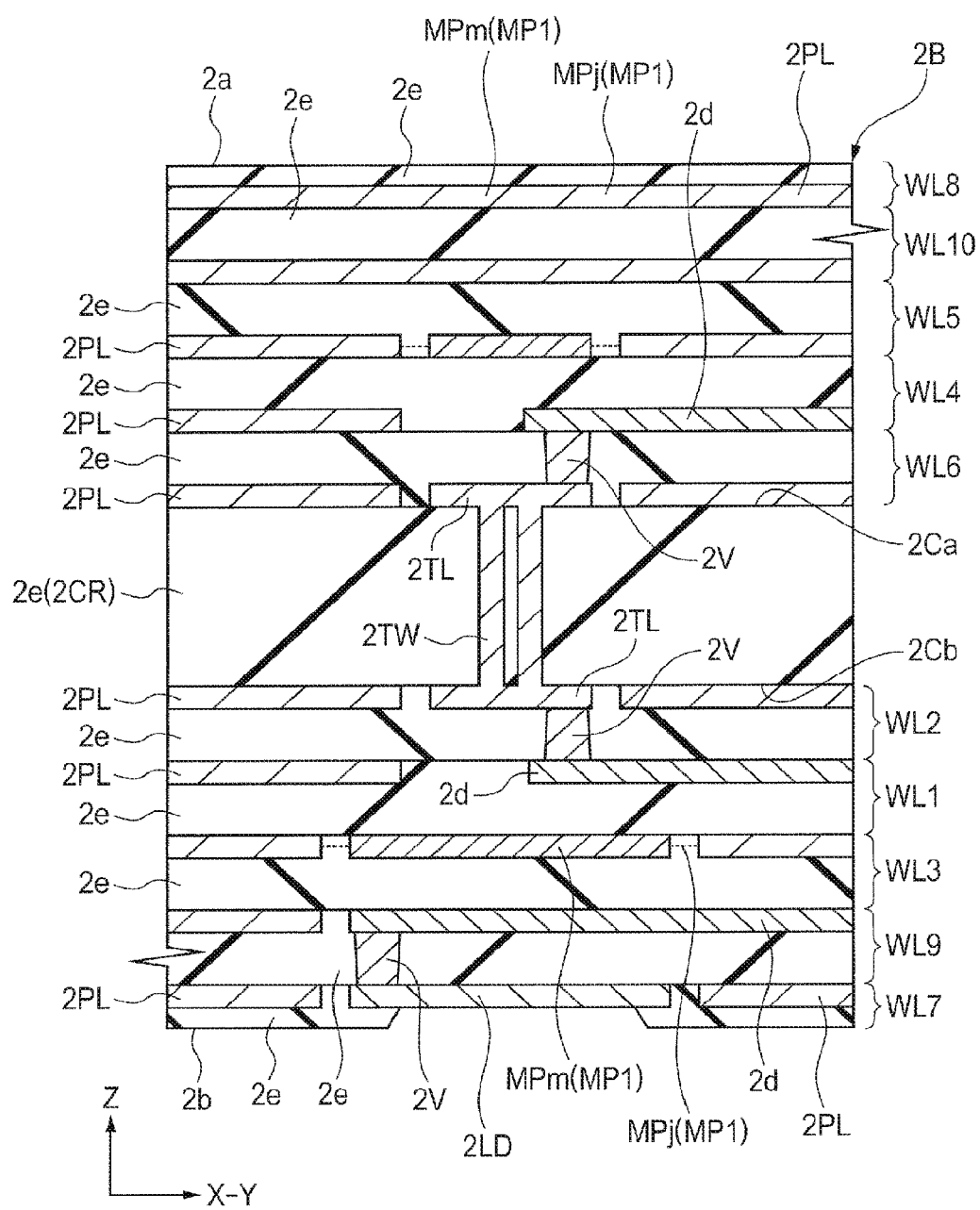
FIG. 12 is an enlarged plan view showing a modification corresponding to FIG. 7.

When the through hole land 2TL and the land 2LD overlap the thickness direction due to the relation between the layout and quantity of the through hole lands 2TL and the lands 2LD, the number of wiring layers may be increased, and a conductor pattern MP1 can be formed between the through hole lands 2TL and the lands 2LD that overlap in the thickness direction as in the modifications shown in FIG. 11 and FIG. 12.

The wiring substrate 2A of the modification shown in FIG. 11 differs from the wiring substrate 2 shown in FIG. 9 in the point that a wiring layer WL7 where a land 2LD is formed, is mounted adjacent to the further lower layer side (mounting surface side) of the wiring layer WL3 where the conductor pattern MP1 is formed. Seen from a different view, the wiring substrate 2A for the modification shown in FIG. 11 differs from the wiring substrate 2 shown in FIG. 9 in the point that plural conductor patterns MP1 are formed over the wiring layer WL3, and moreover plural lands 2LD are formed over a wiring layer WL7 different from the wiring layer WL3. The wiring substrate 2A also contains a wiring layer WL1 where the wire 2d for transmitting signals (signal current flows) and the wiring layer WL3 where the conductor pattern MP1 is formed, and that are formed between the wiring layer WL2 where the through hole land 2TL is formed and the wiring layer WL7 where the land 2LD is formed.

In the case of the wiring substrate 2A, the number of wiring layers increases more than the wiring substrate 2 shown in FIG. 8 and FIG. 9. However, even if the land 2LD and the through hole land 2TL overlap in the thickness direction, the conductive pattern MP1 serving as the electromagnetic wave absorber can be placed at the position where the through hole land 2TL and the land 2LD overlap in the thickness direction. Therefore, the widening of the scattered electromagnetic wave that occurs in the coupling section of the through hole land 2TL and the wire 2d can be prevented.

The land 2LD shown in FIG. 11 is an external terminal that supplies the standard (or reference) electric potential. A portion of the conductor plane 2PL is therefore exposed from the insulation layer 2e and is utilized as the land 2LD. In this case, a via wire 2V coupling the conductor plane 2PL of the wiring layer WL7 and the conductor plane 2PL of the wiring layer WL3 can be placed at a position not overlapping the conductor pattern MP1. A conductor pattern MP1 having the same planar shape as the conductor pattern MP1 shown for example in FIG. 7 can therefore be formed as an electromagnetic wave absorber.

The wiring substrate 2B for the modification shown in FIG. 12, differs from the wiring substrate 2A shown in FIG. 11 in the point that a wiring layer WL9 is mounted formed with a wire 2d coupling to the land 2LD between the wiring layer WL7 formed with a land 2LD and a wiring layer WL3 formed with a conductor pattern MP1. The wire 2d formed in the wiring layer WL9 is a portion of the signal transmission path (signal current flows) that transmits the same or different signals as the wire 2d formed in the wiring layer WL1; and is coupled by way of the via wire 2V to the land 2LD. Seen in another way, the wiring substrate 2B for the modification shown in FIG. 12 differs from the wiring substrate 2A shown in FIG. 11 in the point that the wire 2d that configures the respective signal paths (signal current flows) is formed in the upper layer and the lower layer of the conductor pattern MP1.

In the case of the wiring substrate 2B, the number of wires is increased even more than the wiring substrate 2A shown in FIG. 11. However, a conductor pattern MP1 serving as an electromagnetic wave absorber can be placed at a position overlapped with the wire 2d coupled to the through hole land 2TL and the wire 2d coupled to the land 2LD in the thickness direction, even if the land 2LD that is a signal transmission path, and the through hole land 2TL that is a signal transmission path overlap in the thickness direction. The widening of the scattered electromagnetic waves emitted in the section coupling the wire 2d and the through hole land 2TL towards the land 2LD can therefore be prevented. Moreover, the widening of the scattered electromagnetic wave emitted in the section coupling the land 2LD and the wire 2d towards the though hole land 2TL can be prevented. In other words, in the case of the wiring substrate 2B, the effect of the electromagnetic waves that are emitted at the lower layer of the conductor pattern MP1 and the electromagnetic waves generated in the upper layer of the conductor pattern MP1 can be respectively decreased by the conductor pattern MP1 formed in the wiring layer WL3.

Also, in the case of the wiring substrate 2B, the signal current flowing in the wire 2d that is formed in the wiring layer WL9, and the signal current flowing in the wire 2d that is formed in the wiring layer WL1 may be the same signal current or may be a different signal current. In other words, the effect can also be achieved for the case where the wire 2d formed in the wiring layer WL9 and the wire 2d formed in the wiring layer WL1 configure one signal transmission path, or the case where configuring another signal transmission path.

The wiring substrate 2A shown in FIG. 11 contains a wiring layer WL8 formed with a conductor plane 2PL formed in a further upper layer of the wiring layer WL5 where a conductor pattern MP1 is formed. The wiring substrate 2B shown in FIG. 12 contains a wiring layer WL10 where a conductor plane 2PL is formed between the wiring layer WL8 and the wiring layer WL. The wiring layer WL8 that is shown in FIG. 11 and FIG. 12 or the wiring layer WL10 that is shown in FIG. 12 can be omitted when there is no large diameter (width) pattern such as the land 2LD that is formed on the upper surface 2Ca side of the insulation layer 2CR. However, from the standpoint of suppressing curvature deformation on the wiring substrate by approaching the values for the expansion coefficients on the upper surface 2Ca side and lower surface 2Cb side of the insulation layer 2CR serving as the core layer, the number of layers in the wiring layers that are formed on the upper surface 2Ca side and lower surface 2Cb side of the insulation layer 2CR are preferably the same.

Figure 13:
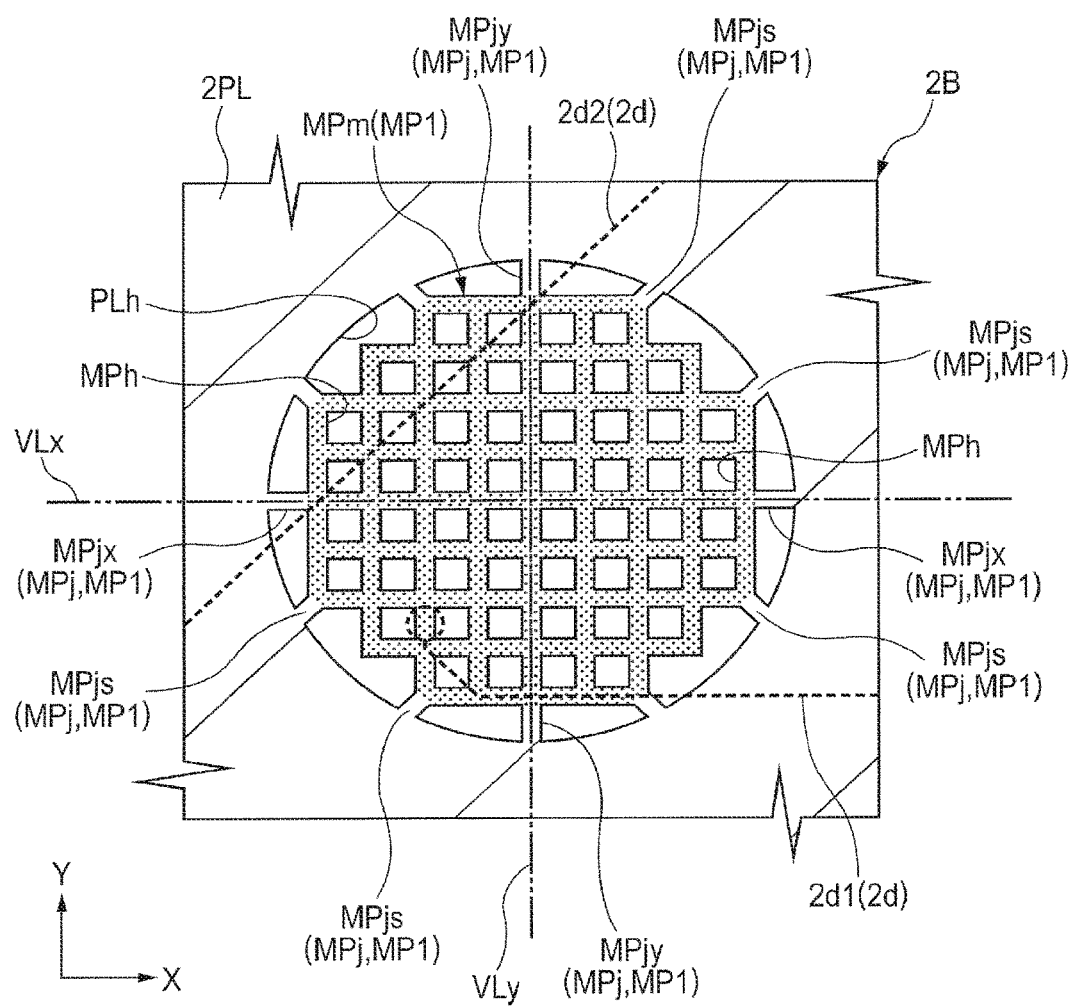
FIG. 13 is an enlarged plan view showing another modification corresponding to FIG. 7.
Figure 14:
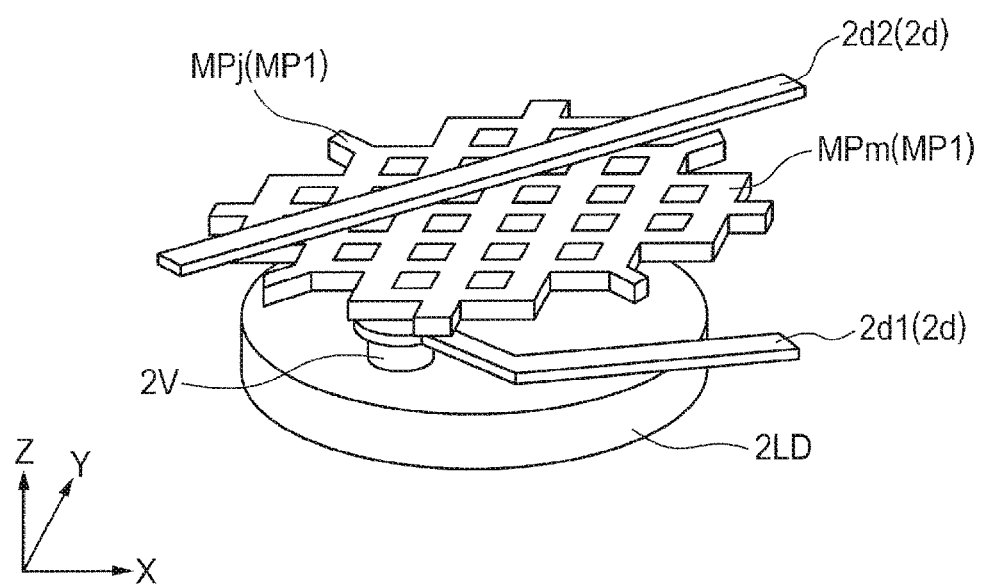
FIG. 14 is an enlarged perspective view showing the periphery of the conductor pattern of FIG. 13.

When many conductor patterns MP1 are formed over a single wiring layer of the wiring substrate 2, plural signal transmission paths might overlap over one conductor pattern MP1. For example, in the examples shown in FIG. 13 and FIG. 14, a wire 2d1 is formed to transmit a first signal to a wiring layer of a lower layer adjacent to the wiring layer where the conductor pattern MP1 is formed. Also, a wire 2d2 is formed to transmit a second signal different from the first signal current, to the wiring layer of an upper layer adjacent to the wiring layer where the conductor pattern MP1 is formed. Respectively different types of signals are transmitted to the wire 2d1 and the wire 2d2 so that crosstalk noise is emitted when the return paths of each signal transmission path overlap.

However the conductor pattern MP1 of the present embodiment is electrically coupled by way of plural couplings MPj to a conductor plane 2PL (See FIG. 13) serving as the ground plane as already described. A portion of the of the conductor pattern MP1 can therefore be utilized as the return path so that overlapping the return path for each signal transmission path becomes difficult. Also in the present embodiment, the distances for the return path and the signal transmission path can made nearly as described above. Therefore the effect from crosstalk noise in the signal paths can be reduced.

<Manufacturing Method for Semiconductor Device>

Figure 15:
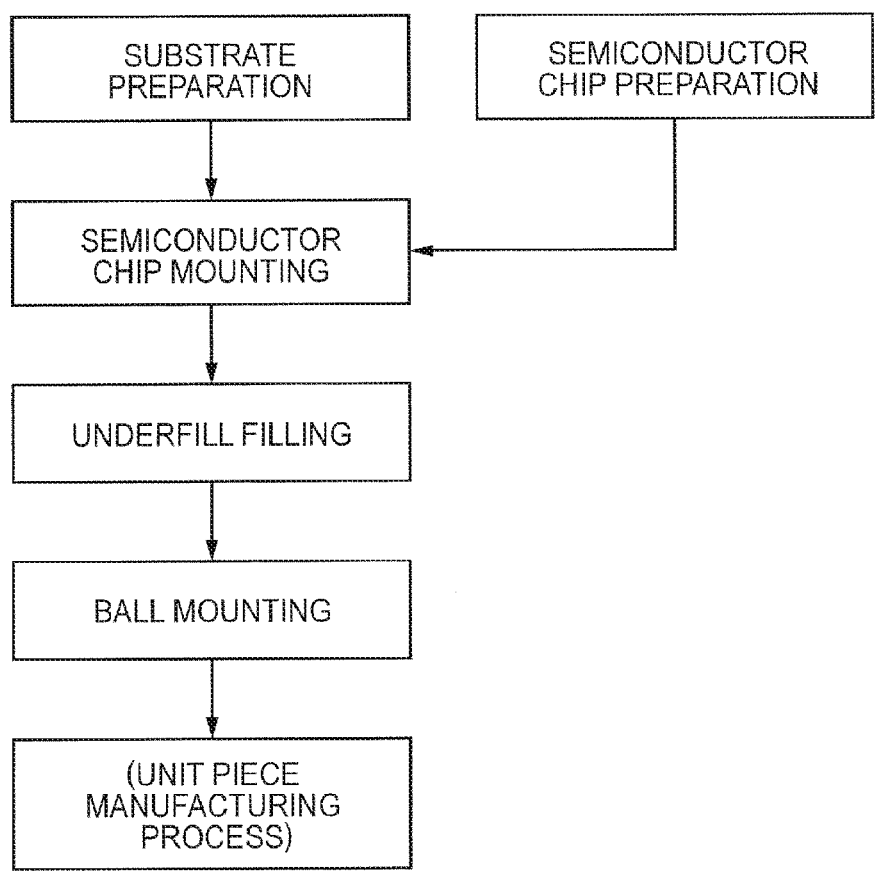
FIG. 15 is a drawing for describing the flow in the assembly process for the semiconductor device shown in FIG. 1 through FIG. 4.

The manufacturing method (assembly method) for the for the semiconductor device 1 shown in FIG. 1 through FIG. 4 shown in FIG. 1 through FIG. 4 is described next while referring to the flow chart shown in FIG. 15. FIG. 15 is a drawing for describing the flow in the assembly process for the semiconductor device shown in FIG. 1 through FIG. 4. In the following description for the manufacturing method, a wiring substrate 2 formed in advance for the product size is prepared and the method for manufacturing a single semiconductor device 1 is described. However as a modification, a so-called multi-piece board segmented into plural product forming regions is prepared, and after assembly for the respective product forming regions, the multi-piece manufacturing method can also be applied to sub-divide into each of the product forming regions and obtain plural semiconductor devices. The unit piece manufacturing process that is applied during the multi-piece manufacturing method is therefore written in parentheses in FIG. 15.

In the substrate preparation process shown in FIG. 15, the wiring substrate 2 shown in FIG. 4 is first of all prepared. Besides preparation for manufacturing the wiring substrate 2, the expression "preparing the wiring substrate 2" also includes the purchase of a finished product wiring substrate 2 and performing preparation. Except for the point that solder ball 4 shown in FIG. 4 is still not coupled, and the point that the semiconductor chip 3 is not mounted, the wiring substrate 2 prepared in this process is a structural material that is pre-formed as described while referring to FIG. 1 through FIG. 14. However, solder material (solder bumps) are each pre-formed joined to the projecting electrodes 3BP, over the plural bonding pads 2PD of the wiring substrate 2.

Figure 16:
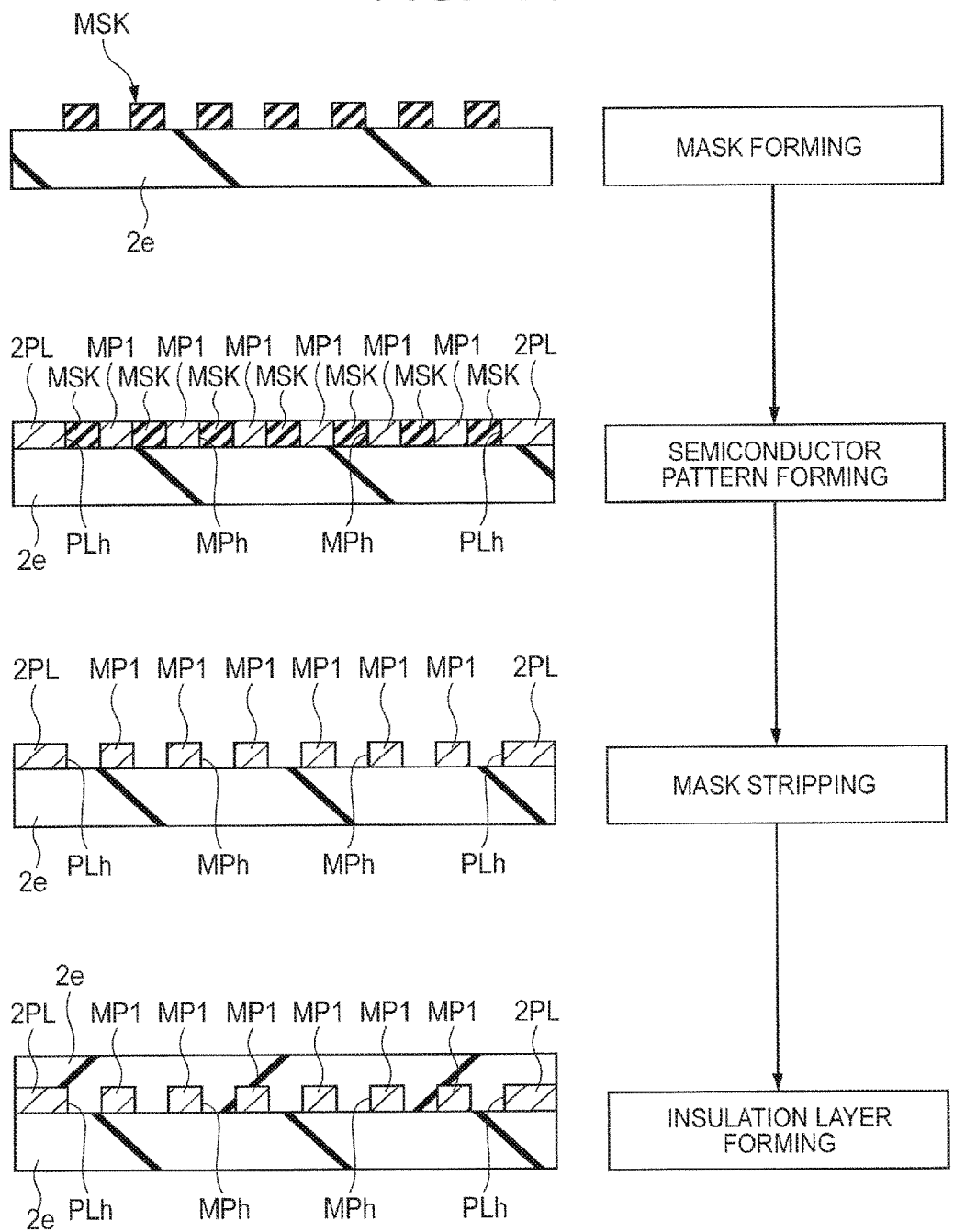
FIG. 16 is a drawing for diagrammatically describing the production process for forming the conductor pattern serving as the electromagnetic wave absorber over the wiring substrate in the substrate preparation process of FIG. 15.

The semiconductor pattern MP1 shown in FIG. 7 through FIG. 14 is for example formed as described below. FIG. 16 is a drawing for diagrammatically describing the production process for forming the conductor pattern serving as the electromagnetic wave absorber over the wiring substrate in the substrate preparation process shown in FIG. 15.

The semiconductor pattern MP1 shown in FIG. 7 through FIG. 14 is collectively formed simultaneous with the other metal patterns formed in the same layer (same wiring layer) such as the conductor plane 2PL and the wire 2d shown in FIG. 4. In the example shown in FIG. 16, a mask MSK in a film shape is first of all formed over the conductor pattern surface of the insulation layer 2e as the mask forming process. The mask MSK is formed in a position where the conductor pattern MP1 (See FIG. 7) is not formed, and in the example shown in FIG. 7, the mask MSK is formed in a section corresponding to the plural aperture sections MPh or the aperture section PLh.

Next, a metal film that is formed by metal deposition patterning is deposited in the aperture section of the mask MSK as forming the conductor pattern. This metal film is comprised of the conductor pattern MP1 and the conductor plane 2PL.

Next, in the mask stripping process, the film shaped mask MSK is removed. When the mask MSK is removed, the aperture MPh and aperture PLh are formed over the section where the mask MSK is present.

Next, in the insulation layer forming process, an insulation layer 2e serving as the built-up layer is formed so as to cover the conductor pattern MP1 and the conductor plane 2PL. In this process, an insulation layer 2e is embedded within the aperture section MPh and within the aperture section PLh of the conductor pattern MP1.

The above described conductor pattern MP1 of the present embodiment is formed at one time simultaneous with the conductor plane 2PL or wire 2d (See FIG. 4) so that there are no further manufacturing process additions even if a conductor pattern MP1 is formed.

In the semiconductor chip preparation process shown in FIG. 15, the semiconductor chip 3 shown in FIG. 4 is prepared. An insulation film is formed over the surface 3a of the semiconductor chip 3 so as to cover the base material and wiring of the semiconductor chip 3. The respective surfaces of the plural pads 3PD are exposed from the insulation film at the aperture section formed over this insulation film. The plural pads 3PD are each comprised of a metal and in the present embodiment are for example aluminum (Al). Plural projecting electrodes 3BP are respectively coupled to the plural pads 3PD, and the plural pads 3PD of semiconductor chip 3 and the plural bonding pads 2PD of the wiring substrate 2 are respectively electrically coupled by way of the plural projecting electrodes 3BP. The projecting electrodes 3BP are for example stacked solder material or a so-called solder bump stacked by way of an underlayer metal film (under-bump metal) over the pad 3PD.

Next, in the semiconductor chip mounting process, a semiconductor chip 3 such as shown in FIG. 4 is mounted over the upper surface 2a serving as the chip mounting surface of the wiring substrate 2. In the present embodiment, mounting is performed by the face down mounting method (or the flip chip method) so that the surface 3a where the plural pads 3PD are formed is facing opposite the upper surface 2a of the wiring substrate 2. In this case, the circuits formed over the semiconductor chip 3, and the circuits (transmission circuit) formed over the wiring substrate 2 are electrically coupled by joining the solder bumps respectively formed over the plural bonding pads 2PD of the wiring substrate with the plural projecting electrodes 3BP.

Next, in the underfill filling process, the underfill resin (insulation film resin) 5 is placed between the semiconductor chip 3 and wiring substrate 2 as shown in FIG. 4. The underfill resin 5 is placed so as to seal the space between the surface 3a of the semiconductor chip 3 and the upper surface 2a of the wiring substrate 2. The underfill resin 5 is comprised of insulation material (non-conducting material) (for example resin material) and is filled so as to seal the electrical coupling section (coupling section for the plural projecting electrodes 3BP) of the semiconductor chip 3 and the wiring substrate 2.

Another mounting method as a modification utilizing the underfill resin 5 can be applied in which prior to the semiconductor chip mounting process shown in FIG. 15, a pre-coating of resin material as a film or a paste (not shown in drawing) can be applied over the chip mounting region serving as the scheduled region for mounting the semiconductor chip 3, and the semiconductor chip 3 pressed from over the insulation material.

Next, in the ball mount process, plural solder balls 4 are mounted on the lower surface 2b side serving as the mounting surface for the wiring substrate 2. In this process, the plural solder balls 4 are placed over the land 2LD exposed from the insulation layer 2e on the mounting surface side shown in FIG. 4, and the plural solder balls 4 can be mounted by reflow processing (process for cooling after heating the solder components and melt-joining).

When performing the unit piece manufacturing process, in order to obtain the plural semiconductor devices 1, the unit pieces are made in each product forming region by slicing the wiring substrate used for the multi-piece manufacturing along the dicing line (parting line) that segments the plural product forming regions.

Afterwards, the necessary testing and inspections such as for external inspections and electrical tests are performed, and shipping or board mounting not shown in the drawings is performed.

<Modifications>

The specific description given above is based on the embodiment of the invention rendered by the present inventors. However the present invention is not limited to the embodiment and needless to say, all manner of modifications not departing from the spirit and scope of the present invention are permissible. A number of modifications of the embodiment are already described but representative modifications of the above described embodiment are hereafter described.

In the above described embodiment, an example of the semiconductor device 1 is described as shown in FIG. 4 utilizing a wiring substrate 2 containing an insulation layer 2CR comprised of prepreg material as the core layer. However, the technology described for the embodiment may also apply to a so-called coreless substrate formed by stacking build-up layers not containing a core. In this case, no through hole wire 2TW and no through hole land 2TL penetrating through the core layer are formed. Therefore, the noise immunity of the semiconductor device 1 can be improved if the conductor pattern MP1 is formed at a position mainly overlapped with the land 2LD in the thickness direction as shown in FIG. 8.

Figure 17:
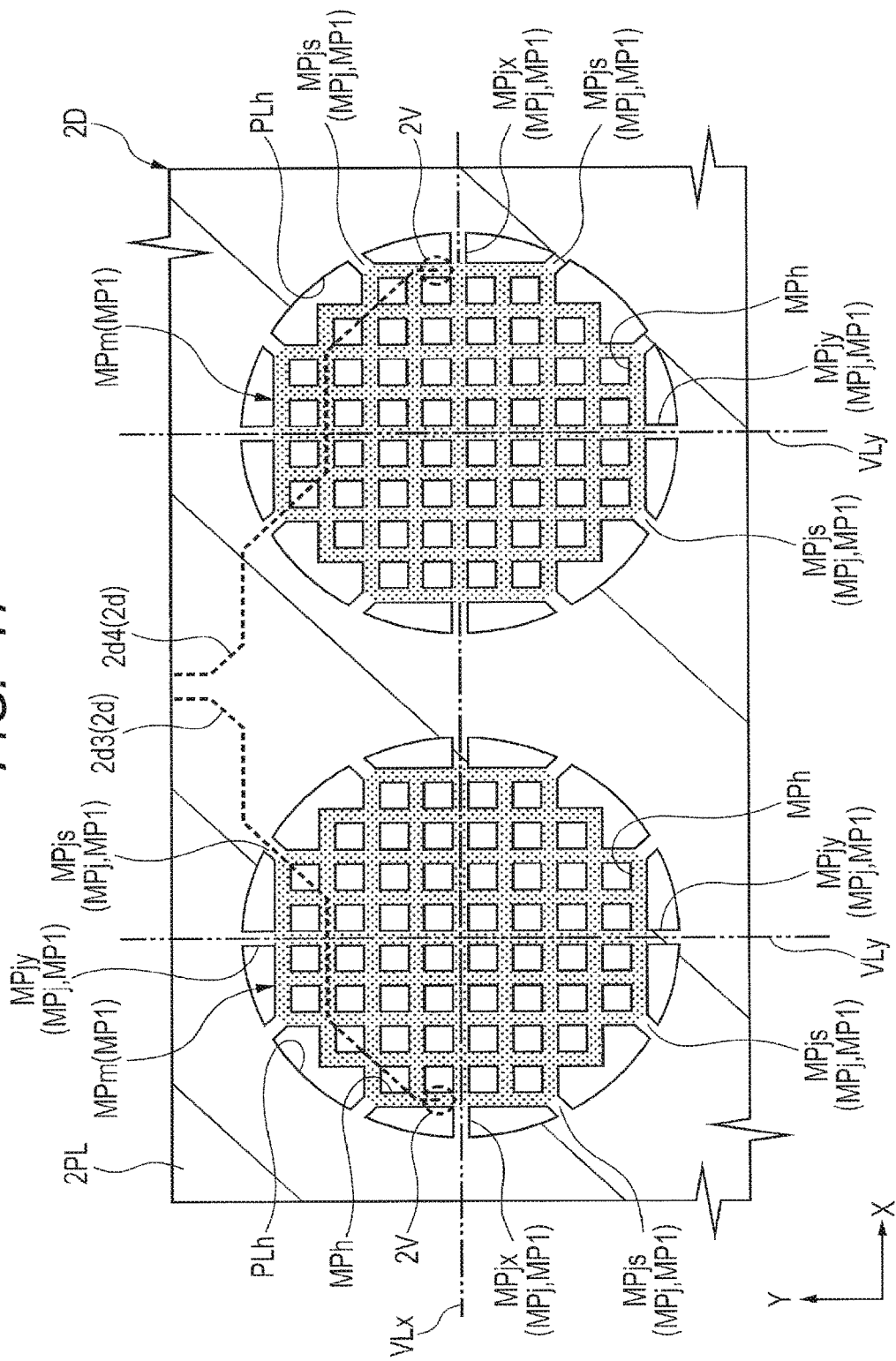
FIG. 17 is an enlarged plan view showing a modification example corresponding to FIG. 7.

Also, as signal types in the above embodiment, an example is described utilizing so-called single-end signals where the "H" level and "L" level are set as the signal voltage levels with ground electric potential as the standard. However, among the signal types there are differential signals in which signals electric potentials are respectively supplied to a pair of signal transmission paths (differential pair) and the electric potential difference for the differential pair are set to the "H" level and "L" level. The technology described for the above embodiment can also be applied to signal transmission paths for transmitting differential signals. FIG. 17 is an enlarged plan view showing modification corresponding to FIG. 7.

The wiring substrate 2D shown in FIG. 17 differs from the wiring substrate 2 shown in FIG. 7 in the point that a differential signal flows in the wire 2d. More specifically, an aperture section PLh is formed at a position overlapped with a portion of the wire 2d3 that is one of the differential pair in the thickness direction, in the conductor plane 2PL of the wiring layer where the conductor plane MP1 is formed among the wiring layers of the wiring substrate 2D. Moreover, another aperture section PLh is formed at a position overlapped with a portion of the wire 2d4 that is the other portion of the differential pair in the thickness direction, in the conductor plane 2PL. Also, respective conductor patterns MP1 are formed in the two different aperture sections PLh.

The differential pair is comprised of the wire 2d3 and the wire 2d4, and these configure the signal transmission path along which the differential signals are sent. The wire 2d3 and the wire 2d4 are mutually formed in the same wiring layer, and the wiring layer where the conductor pattern MP1 is formed is adjacent to the wiring layer where the wire 2d3 and the wire 2d4 are formed.

In the case of the single-end signal that is described in the above embodiment, maintaining a fixed gap distance for the signal transmission path and the return path is described as an essential noise countermeasure. In the case of the differential signal, besides maintaining each signal transmission path and return path at a fixed gap distance, matching the impedance along the signal transmission path pair is also important. In the modification shown in FIG. 17, electrically coupling each of the conductor patterns MP1 to the conductor plane 2PL serving as the ground plane, allows the conductor pattern MP1 serving as the electromagnetic wave absorber to function as a portion of the return path for each signal transmission path.

The main pattern section MPm of the conductor pattern MP1, is comprised of mesh patterns containing plural aperture sections MPh placed at regular intervals. Utilizing a mesh pattern for the planar shape of the main pattern section MPm results in a return path that is formed along the mesh shape. Therefore, a return path can be formed along the direction that the wires 2d3, 2d4 extend, regardless of the layout of the wires 2d3, 2d4 that are formed at positions overlapped with the conductor pattern MP1 in the thickness direction.

Therefore, impedance matching of the differential pair can be easily attained in the wiring substrate 2D shown in FIG. 17 if the shapes of the wire 2d3 and the wire 2d4 serving as the differential pair can be configured in appropriate shapes. Also, in the above described embodiment, forming plural coupling sections MPj to couple the conductor plane 2PL with the main pattern section MPm allows forming the wires 2d3, 2d4 along the coupling section MPj.

Though a redundant description is omitted, the preferred shape of the conductor pattern MP1 (for example a shape preferred from the standpoint of improving the degree of freedom of the wiring layout) of the above described embodiment, can be applied in the same way to an embodiment for transmitting the differential signal shown in FIG. 17. In this case, using the same shape for the conductor pattern MP1 overlapping the wire 2d4 and the conductor pattern MP1 overlapping the wire 2d3 is preferable from the standpoint achieving impedance matching.

Figure 18:
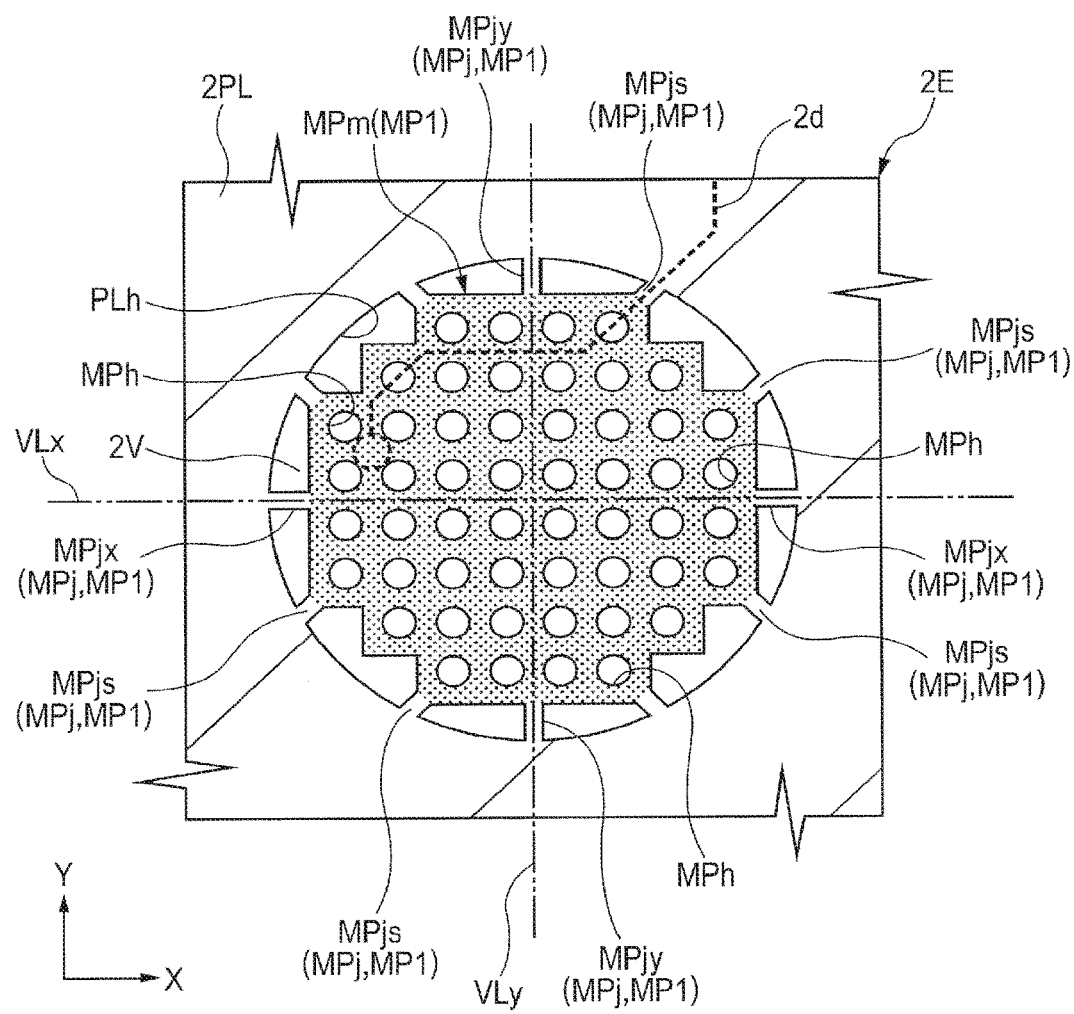
FIG. 18 is an enlarged plan view showing another modification example corresponding to FIG. 7.
Figure 19:
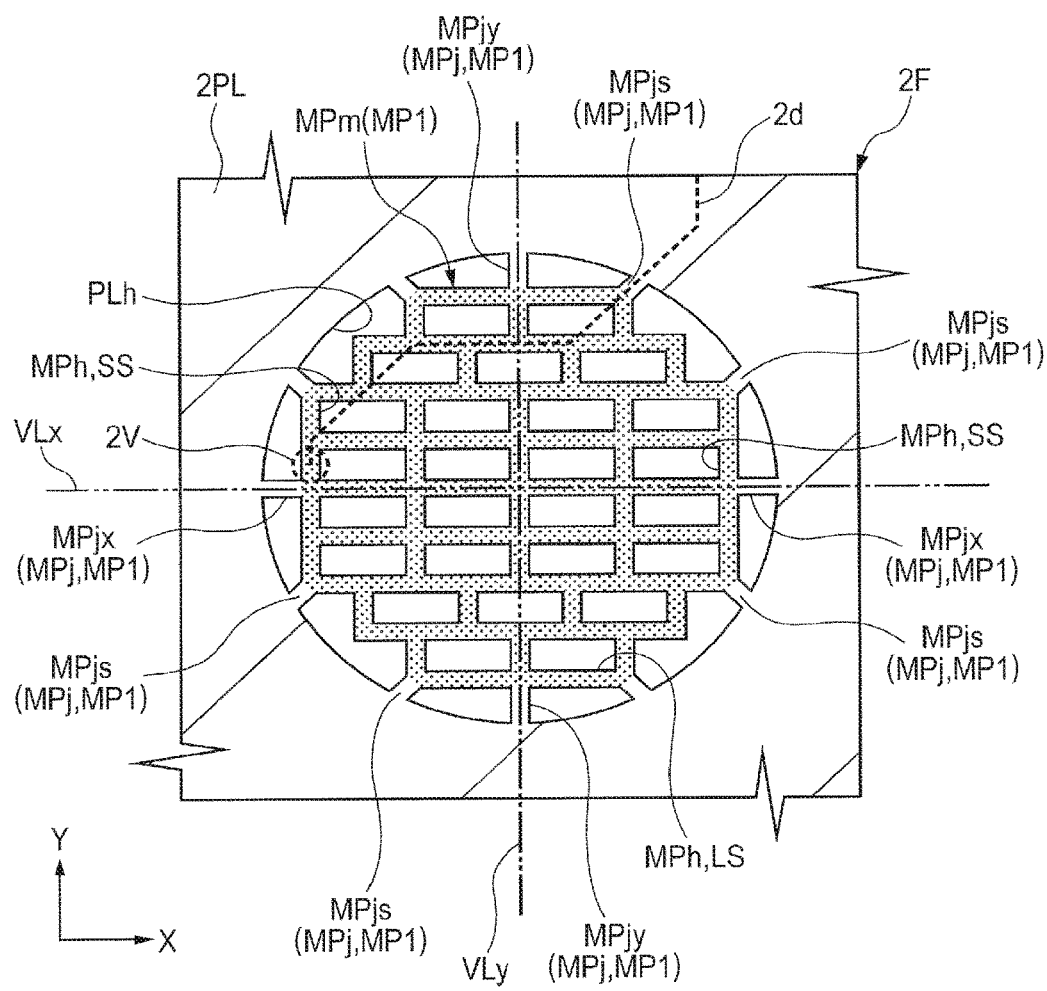
FIG. 19 is an enlarged plan view showing another modification example corresponding to FIG. 7.

In the above embodiment, an example of a plural square aperture sections MPh arrayed a grid shape is described as an example of the planar shape of the main pattern section MPm of the conductor pattern MP1, however various modifications can be applied. In the wiring substrate 2E shown in FIG. 18 for example, the aperture shapes of the plural aperture sections MPh formed in the main pattern section (mesh pattern section) MPm of the conductor pattern MP1, form a circle. Also for example, in the wiring substrate 2F shown in FIG. 19, the aperture shapes of the plural aperture sections MPh formed in the main pattern section (mesh pattern section) MPm of the conductor pattern MP1, form a rectangle.

As described by utilizing shown in FIG. 16, when utilizing the mask MSK during the forming of the conductor pattern MP1 serving as the mesh pattern, peeling of the mask MSK might occur during the manufacturing process when the aperture diameter of the aperture section MPh becomes small. As shown for the wiring substrate 2F shown in FIG. 19, the planar area of the mask MSK becomes large if the aperture shape of the aperture section MPh is a rectangle so the peeling of the mask MSK prior to the process for forming the conductor pattern shown in FIG. 16 can be prevented.

Figure 20:
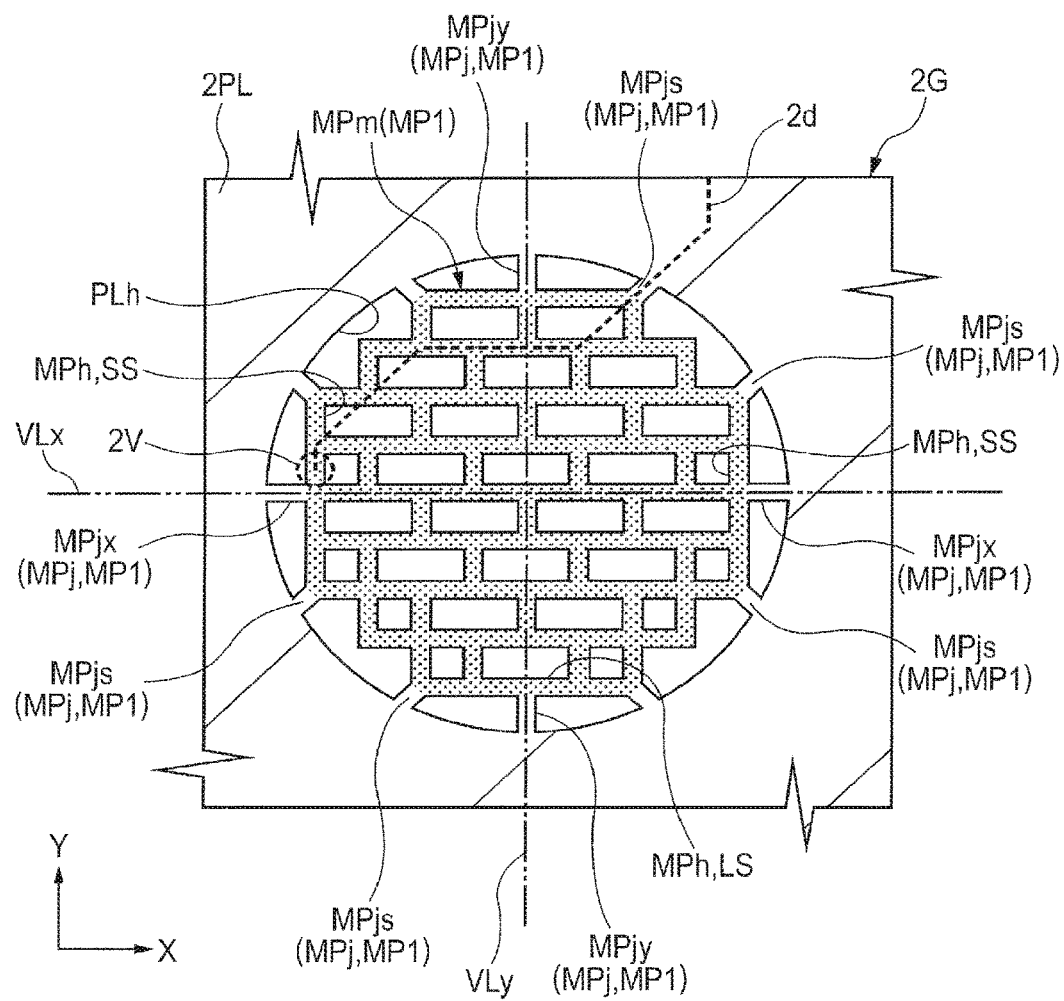
FIG. 20 is an enlarged plan view showing another modification example corresponding to FIG. 7.

In the wiring substrate 2G shown in FIG. 20, the shape of the plural aperture sections MPh formed in the main pattern section (mesh pattern section) MPm of the conductor pattern MP1 is a mix of squares and rectangle shapes. Also, in the plural aperture sections MPh of the wiring substrate 2F, among the long side LS and short side SS forming the contour of the plural rectangle, the short side SS are arrayed in a zigzag shape so as not to form a single row relative to the Y direction. In this case, the extent of the offset or deviation between the return path and the wire 2d can be suppressed even when the planar area of the aperture section MPh becomes large. In FIG. 20, an example is shown of mixing the rectangular aperture sections MPh and the square aperture sections MPh in order to achieve a zigzag array however the array can be achieved just by using the rectangular aperture sections MPh.

When the aperture section MPh is a mix of rectangular aperture sections MPh and square aperture section MPh as in the wiring substrate 2G shown in FIG. 20, forming the planar shape of the conductor pattern MP1 so as to be point-symmetric relative to the center of the aperture section PLh is difficult as in the wiring substrate 2 shown in FIG. 16. In this case, from the standpoint of improving the degree of freedom in the layout design of the wire 2*d*, the planar shape of the conductor pattern MP1 is preferably line-symmetric with one (for example, the virtual line VLy in the example shown in FIG. 20) of the center lines passing through the center of the aperture section PLh, even in the case where some number of coupling sections MPjs are placed.

The various above described modifications can also be effectively applied as combinations of each of the above described embodiments.

Extracting the representative technical concept for the semiconductor device and the semiconductor device manufacturing method of the above described embodiment and modifications allows stating the following aspects.

Supplementary Note 1

A manufacturing method for a semiconductor device including:

(a) a process that prepares a wiring substrate comprised of a chip mounting surface, a mounting surface placed on the side opposite the chip mounting surface, plural first terminals placed over a chip mounting surface, plural second terminal placed on the mounting surface, and plural layers of wiring layers electrically coupling the plural first terminals and the plural second terminals;

(b) a process that mounts a semiconductor chip including a surface where plural electrode pads are formed, and a rear surface that is placed on the opposite side of the surface, over a semiconductor chip mounting surface of a wiring substrate and the plural electrode pads of the semiconductor chip and the plural first terminals are respectively electrically coupled;

the plural wiring layers include a first wiring layer in which a first wiring layer is formed where a first signal is transmitted, and a second wiring layer mounted adjacent to the upper layer and the lower layer of the first wiring layer, a first conductor plate containing a first aperture section at a position overlapped with a portion of the first wire in the thickness direction, and a first conductor pattern placed within the first aperture section of the first conductor plate are formed over the second wiring layer, the first aperture section is formed so as to pass through the first conductor place in the thickness direction, and the first conductor pattern includes a mesh pattern section that is isolated from the first conductor plate, and plural coupling sections that couple the mesh pattern section and the first conductor plate.

What is claimed is:

1. A semiconductor device comprising:
a semiconductor chip including a obverse surface, a rear surface opposite the obverse surface, and an electrode pad formed on the obverse surface;
a wiring substrate including a first main surface, a second main surface opposite the first main surface, a terminal formed on the first main surface and electrically connected with the electrode pad of the semiconductor chip which is mounted on the wiring substrate such that the obverse surface faces the first main surface of the wiring substrate;
wiring layers including a first wiring layer and a second wiring layer;
a first wire formed in the first wiring layer, the second wiring layer formed between the first main surface and the first wiring layer in a thickness direction;
a first plate formed in the second wiring layer and having a first aperture section at a position overlapped with a portion of the first wire; and
a first pattern formed within the first aperture section in the second wiring layer and having a plurality of openings,
wherein the first pattern is electrically and mechanically connected with the first plate by way of a plurality of first coupling sections in the second wiring layer, and
wherein an interval between two openings next to each other of the plurality of the openings is greater than or equal to a width of each of the plurality of first coupling sections in a plan view.

2. The semiconductor device according to claim 1, wherein the first pattern includes a mesh pattern section in the plan view.

3. The semiconductor device according to claim 1, wherein the wiring substrate includes:
a core layer that includes a first surface positioned on the first main surface side of the wiring substrate, and a second surface opposite the first surface;
a through hole electrode that passes through from the first surface of the core layer to the second surface of the core layer in the thickness direction; and
a first through hole land that is connected with the through hole electrode on the first surface and that is connected with the first wire by way of a first via wire in the thickness direction, and
wherein the first pattern is formed above the first through hole land and overlaps the first through hole land.

4. The semiconductor device according to claim 3, wherein the wiring substrate includes:
a second through hole land that is connected with the through hole electrode on the second surface in the thickness direction; and
a second pattern that is formed below the second through hole land in the thickness direction, and
wherein the second pattern overlaps the second through hole land.

5. The semiconductor device according to claim 4, wherein the first pattern and the second pattern are the same shape.

6. The semiconductor device according to claim 5, wherein a length of the second pattern is larger than a length of the first pattern in a direction along the first main surface of the wiring substrate.

7. The semiconductor device according to claim 5, wherein the second pattern includes a plurality of openings.

8. The semiconductor device according to claim 5, wherein the second pattern includes a mesh pattern section in the plan view.

9. The semiconductor device according to claim 5, wherein the wiring substrate includes a second wire that is formed between the second through hole land and the second pattern, and
wherein the second wire is connected with the second through hole land by way of a second via wire in the thickness direction.

10. The semiconductor device according to claim 5, wherein the wiring substrate includes:
a third wiring layer that is formed between the second pattern and the second main surface of the wiring substrate; and
a second plate that is formed in the third wiring layer and has a second aperture section at a position overlapped with a portion of the second wire, wherein the second pattern is arranged in the second aperture section of the second plate, and wherein the second pattern is connected with the second plate by way of a plurality of second coupling sections.

11. The semiconductor device according to claim 1, further comprising an external electrode formed on the second main surface and electrically connected with the terminal via a plurality of wiring layers.

* * * * *